(12) United States Patent
Jing et al.

(10) Patent No.: US 7,575,847 B2
(45) Date of Patent: *Aug. 18, 2009

(54) LOW REFRACTIVE INDEX COMPOSITION COMPRISING FLUOROPOLYETHER URETHANE COMPOUND

(75) Inventors: Naiyong Jing, Woodbury, MN (US); Thomas P. Klun, Lakeland, MN (US); Chuntao Cao, Woodbury, MN (US); William D. Coggio, Hudson, WI (US); Zai-Ming Qiu, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 174 days.

This patent is subject to a terminal disclaimer.

(21) Appl. No.: 11/427,665

(22) Filed: Jun. 29, 2006

(65) Prior Publication Data

US 2007/0287093 A1   Dec. 13, 2007

Related U.S. Application Data

(60) Provisional application No. 60/804,593, filed on Jun. 13, 2006.

(51) Int. Cl.
*G03F 7/00* (2006.01)
*G03F 7/004* (2006.01)
*B32B 7/02* (2006.01)

(52) U.S. Cl. .............. 430/270.1; 430/311; 428/220; 428/532; 428/421; 428/212; 525/326.3; 526/247

(58) Field of Classification Search ............... 428/220, 428/532, 421, 212; 526/247; 525/326.3; 430/270.1

See application file for complete search history.

(56) References Cited

U.S. PATENT DOCUMENTS

| | | | |
|---|---|---|---|
| 3,787,351 A | 1/1974 | Olson | |
| 4,085,137 A | 4/1978 | Mitsch et al. | |
| 4,321,404 A | 3/1982 | Williams et al. | |
| 4,614,667 A | 9/1986 | Larson et al. | |
| 4,818,801 A | 4/1989 | Rice et al. | |
| 4,948,852 A | 8/1990 | Moore | |
| 5,846,650 A | 12/1998 | Ko et al. | |
| 6,210,858 B1 | 4/2001 | Yasuda et al. | |
| 6,238,798 B1 | 5/2001 | Kang et al. | |
| 6,299,799 B1 | 10/2001 | Craig et al. | |
| 6,376,572 B1 | 4/2002 | Turri | |

(Continued)

FOREIGN PATENT DOCUMENTS

EP   0379462   2/1995

(Continued)

OTHER PUBLICATIONS

Solvay Solexis; Fluorolink Polymer Modifiers-Product Data Sheet; Sep. 6, 2004, 5 pages.

(Continued)

*Primary Examiner*—Amanda C. Walke
(74) *Attorney, Agent, or Firm*—Carolyn A. Fischer

(57) ABSTRACT

Antireflective films and low refractive index compositions are described. The low refractive index layer comprises the reaction product of a composition comprising at least one free-radically polymerizable material having a high fluorine content, and at least one free-radically polymerizable fluoropolyether urethane material.

17 Claims, 1 Drawing Sheet

U.S. PATENT DOCUMENTS

| | | |
|---|---|---|
| 6,660,338 B1 | 12/2003 | Hargreaves |
| 6,673,887 B2 | 1/2004 | Yamaguchi et al. |
| 6,800,378 B2 | 10/2004 | Hawa et al. |
| 6,906,115 B2 | 6/2005 | Hanazawa et al. |
| 2003/0151029 A1 | 8/2003 | Hsu et al. |
| 2004/0070041 A1 | 4/2004 | Obayashi et al. |
| 2004/0209084 A1 | 10/2004 | Yamaya et al. |
| 2005/0053790 A1 | 3/2005 | Kato |
| 2005/0072336 A1 | 4/2005 | Itoh et al. |
| 2005/0106404 A1 | 5/2005 | Hayashida et al. |
| 2005/0112319 A1 | 5/2005 | Itoh et al. |
| 2005/0123741 A1 | 6/2005 | Hayashida et al. |
| 2005/0158504 A1 | 7/2005 | Itoh et al. |
| 2005/0158558 A1 | 7/2005 | Hayashida et al. |
| 2005/0182199 A1* | 8/2005 | Jing et al. ................ 525/326.3 |
| 2005/0228152 A1* | 10/2005 | Starry et al. ................ 526/247 |
| 2005/0288385 A1 | 12/2005 | Kondo et al. |
| 2006/0057307 A1 | 3/2006 | Matsunaga et al. |
| 2006/0084756 A1 | 4/2006 | Southwell et al. |
| 2006/0105155 A1* | 5/2006 | Ikeyama et al. ............. 428/220 |
| 2006/0216500 A1 | 9/2006 | Klun et al. |
| 2007/0286992 A1 | 12/2007 | Coggio et al. |
| 2007/0286993 A1* | 12/2007 | Radcliffe et al. ............ 428/212 |
| 2007/0287093 A1 | 12/2007 | Jing et al. |

FOREIGN PATENT DOCUMENTS

| | | |
|---|---|---|
| EP | 0870778 | 10/1998 |
| EP | 1057849 | 8/2003 |
| EP | 1411073 | 4/2004 |
| JP | 5209030 | 8/1993 |
| JP | 11080312 | 3/1999 |
| JP | 2004-043671 | 7/2002 |
| JP | 2004-204096 | 7/2004 |
| JP | 2005-126453 | 5/2005 |
| KR | 1020050118911 | 12/2005 |
| WO | WO 01/00701 | 4/2001 |
| WO | WO 03/072625 | 4/2003 |
| WO | WO 03/099904 | 4/2003 |
| WO | WO 03/002628 | 9/2003 |
| WO | WO 2004/044062 | 5/2004 |
| WO | WO 2005/049687 | 10/2004 |
| WO | WO 2005/063484 | 7/2005 |
| WO | WO 2005/103175 | 11/2005 |
| WO | WO 2005/113641 | 12/2005 |

OTHER PUBLICATIONS

Pending U.S. Appl. No. 11/277,162, filed Mar. 22, 2006.

* cited by examiner

LOW REFRACTIVE INDEX COMPOSITION COMPRISING FLUOROPOLYETHER URETHANE COMPOUND

RELATED APPLICATIONS

This application claims priority to U.S. Patent Application Ser. No. 60/804,593 filed Jun. 13, 2006.

BACKGROUND

Various antireflective polymer films ("AR films") have been described. The physical principles by which antireflection films and coatings function are well known. Several overviews can be found, for example, in *Optical Engineering*, S. Muskiant Ed, Vol. 6., *Optical Materials*, Chap. 7, p 161, 1985 and as shown in U.S. Pat. No. 3,833,368 to Land, et al. AR films are often constructed of alternating high and low refractive index ("RI") polymer layers of the correct optical thickness. With regards to visible light, this thickness is on the order of one-quarter of the wavelength of the light to be reflected. The human eye is most sensitive to light around 550 nm. Therefore it is desirable to design the low and high index coating thicknesses in a manner that minimizes the amount of reflected light in this optical range (e.g. 3% or lower).

As described in Groh and Zimmerman, *Macromolecules*, Vol. 24 p. 6660 (1991), it is known that fluorine containing materials have a low refractive index and are therefore useful in the low refractive index layer of AR films.

Various AR coatings using fluoro(meth)acrylate polymers and fluorine containing materials have also been described.

Although increased fluorine content decreases the refractive index of the low refractive index coating composition, the concurrent decrease in surface energy can result in poor coating and optical cosmetic properties as well as a loss in interfacial adhesion with the adjacent high refractive index layer. Also, highly fluorinated materials have been known to reduce the hardness and durability of the coating.

SUMMARY OF THE INVENTION

In one embodiment, a composition having a refractive index of less than 1.47 is described comprising i) one or more free-radically polymerizable materials, each having a fluorine content of at least about 25 wt-%, and ii) at least one free-radically polymerizable fluoropolyether urethane material.

In another embodiment, a composition is described comprising i) greater than 20 wt-% of one or more free-radically polymerizable materials, each having a fluorine content of at least about 25 wt-%, and ii) at least one free-radically polymerizable fluoropolyether urethane material.

In another embodiment, an antireflective film is described comprising a low refractive index layer comprising the reaction product of a composition comprising i) at least one free-radically polymerizable fluoropolymer having a fluorine content of at least about 25 wt-%, and ii) at least one free-radically polymerizable fluoropolyether urethane material; and a high refractive index layer coupled to the low refractive index layer.

In another embodiment, a coating composition is described comprising an organic solvent, at least one fluoropolymer, and at least one free-radically polymerizable multifunctional fluoropolyether urethane material comprising a HFPO- moiety wherein the cured coating composition is repellant to the organic solvent of the coating composition.

In yet another embodiment, a method of photolithography is described comprising coating a low refractive index composition onto a substrate; curing a portion of the coating with radiation, and

DETAILED DESCRIPTION OF PREFERRED EMBODIMENTS OF THE INVENTION

Figure 1:
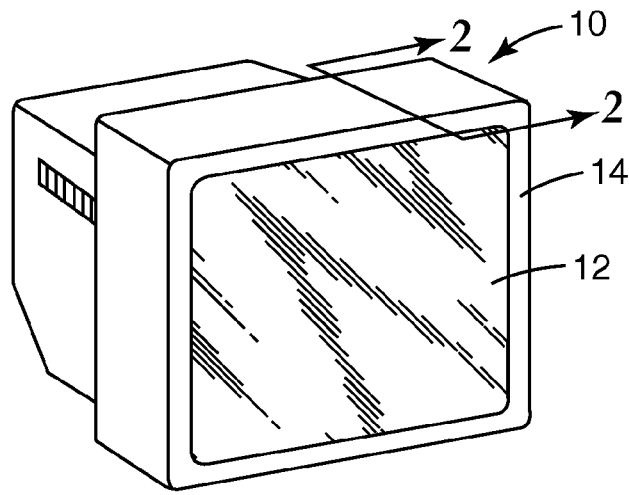
FIG. 1 is perspective view of an article having an optical display.

The recitation of numerical ranges by endpoints includes all numbers subsumed within the range (e.g. the range 1 to 10 includes 1, 1.5, 3.33, and 10.

The phrase "free-radically polymerizable" refers to monomers, oligomers, and polymers having functional groups that participate in crosslinking reactions upon exposure to a suitable source of free radicals. Free-radically polymerizable group include for example (meth)acryl groups, —SH, allyl, or vinyl. The free-radically polymerizable group may be halogenated with for example fluorine such as in the case of —COCF=$CH_2$.

Preferred free-radically polymerizable monomer and oligomers typically comprise one on more "(meth)acryl" groups with includes (meth)acrylamides, and (meth)acrylates optionally substituted with for example fluorine and sulfur. A preferred (meth)acryl group is acrylate. Multi-(meth)acrylate materials comprise at least two polymerizable (meth)acrylate groups; whereas as mono-(meth)acrylate material has a single (meth)acrylate group. Alternatively, the multi-(meth)acrylate monomer can include two or more (meth)acrylate group at one end of the compound. The free-radically polymerizable fluoropolymers typically comprise functional groups that reaction with (meth)acrylate or other (meth)acryl groups.

Presently described are antireflective film articles and low refractive index compositions. The antireflective film articles comprising a low refractive index layer and a high refractive index layer coupled to the low refractive index layer.

The low refractive index layer comprises the reaction product of a i) at least one free-radically polymerizable material having a fluorine content of at least about 35 wt-%; and ii) at least one free-radically polymerizable fluoropolyether urethane compound. The free-radically polymerizable materials will be described herein with respect to (meth)acrylate materials. However, similar results can be obtained by the use of other free-radically polymerizable groups, as known in the art.

One or more low refractive index (meth)acrylate materials are employed wherein each of the material(s) has a fluorine content of at least about 25 wt-%. The low refractive index (meth)acrylate materials may have a fluorine content of at least 30 wt-%, at least 35 wt-%, at least 40 wt-%, at least 45 wt-%, or at least 50 wt-%. In some embodiments, such when component i) comprise a fluoropolymer, the fluorine content of component i) may range up to about 70 wt-% fluorine in order to be soluble in non-fluorinated solvents.

The ii) fluoropolyether urethane (meth)acrylate compound generally has a lower fluorine content than i). The presence of the fluoropolyether urethane (meth)acrylate material can improve the compatibility of i) with for example non-fluorinated (meth)acrylate materials present in the low refractive index composition. The presence of fluoropolyether urethane (meth)acrylate also contributes to the low surface energy (e.g. static contact angles of at least 110°). Low surface energy is amenable to anti-soiling and stain repellent properties as well as rendering the exposed surface easy to clean.

The fluorine content of ii) can range from about 5 wt-% to 40 wt-% and preferably ranges from about 10 wt-% to 30 wt-%.

The fluoropolyether urethane (meth)acrylate material is combined with the low refractive index composition such that the weight ratio of the total amount of high fluorine material(s) i) to the total amount of (e.g. lower fluorine) fluoropolyether urethane material(s) ii) is at least 0.5:1 and typically at least about 1:1. It has been found that small amounts of the fluoropolyether urethane material can compatiblize relatively high concentrations of polymerizable high fluorine materials. The ratio of total high fluorine material i) to total fluoropolyether urethane material ii) can range from 2:1 up to about 5:1.

The total weight percent fluorine of the low refractive index composition is typically at least 15 wt-% fluorine, preferably at least about 20 wt-%. The total fluorine content generally does not exceed about 50 wt-%. In order to provide a low refractive index layer having low haze, (e.g. less than 4%, 3% or 2%), the total fluorine content is typically less than 40 wt-%.

The total amount of low refractive index (i.e. high fluorine containing) (meth)acrylate material varies depending of the fluorine content of the low refractive index monomer(s) employed. The total amount of low refractive index (meth) acrylate material(s) of the organic portion of the composition (i.e. excluding the presence of any inorganic nanoparticles) is at least 10 wt-%, and more typically at least about 15 wt-%. The total amount of high fluorine containing (meth)acrylate material is typically no greater than 70 wt-%. In some embodiments, the amount of high fluorine (meth)acrylate material ranges from about 40 wt-% to about 65 wt-%.

The total amount of fluorinated free-radically polymerizable materials components, i.e. the combination of i) and ii) can be least 30 wt-%, 40 wt-%, 50 wt-%, 60 wt-%, 70 wt-%, 80 wt-%, 90 wt-% and even 100 wt-% based on the total solids of the organic portion on the reaction mixture (i.e. excluding any inorganic nanoparticles). However, the composition typically comprises at least 10 wt-% to 20 wt-% of non-fluorinated crosslinker and/or surface modified inorganic nanoparticles to improve the durability of the low refractive index coating.

Various fluorinated mono- and multi-functional free-radically polymerizable monomers, oligomers, and polymers may be employed in the preparation of the low refractive index composition described herein. Such materials generally comprises free-radically polymerizable moieties in combination with (per)fluoropolyether moieties, (per)fluoroalkyl moieties, and (per)fluoroalkylene moieties. Within each of these classes are multi-functional species having a high fluorine content, (e.g. of at least 25 wt-%) that can be employed as i). Other species within each class, having fluorine content less than 35 wt-%, can be employed as auxiliary components. In some embodiments, other auxiliary fluorinated (meth) acrylate monomers may also aid in compatibilizing the low refractive index or other fluorinated materials present in the reaction mixture.

The low refractive index layer and fluoro(meth)acrylate polymer may be prepared from a variety of (per)fluoropolyether (meth)acrylate compounds. Perfluoropolyether (meth)acryl compounds can be represented by the following Formula (1):

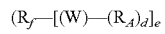
(Formula 1)

wherein $R_f$ is a (per)fluoropolyether group; W is a linking group; and $R_A$ is a free-radically polymerizable group such as (meth)acryl, —SH, allyl, or vinyl, and is preferably a (meth)acrylate or —COCF=CH$_2$ group; d ranges from 1 to 6; and e is 1 or 2.

The perfluoropolyether group $R_f$ can be linear, branched, cyclic, or combinations thereof and can be saturated or unsaturated. The perfluoropolyether has at least two catenated oxygen heteroatoms. Exemplary perfluoropolyethers include, but are not limited to, those that have perfluorinated repeating units selected from the group of —(C$_p$F$_{2p}$)—, —(C$_p$F$_{2p}$O)—, —(CF(Z))-, —(CF(Z)O)—, —(CF(Z)C$_p$F$_{2p}$O)—, —(C$_p$F$_{2p}$ CF(Z)O)—, —(CF$_2$CF(Z)O)—, or combinations thereof. In these repeating units, p is typically an integer of 1 to 10. In some embodiments, p is an integer of 1 to 8, 1 to 6, 1 to 4, or 1 to 3. The group Z is a perfluoroalkyl group, perfluoroether group, perfluoropolyether, or a perfluoroalkoxy group, all of which can be linear, branched, or cyclic. The Z group typically has no more than 12 carbon atoms, no more than 10 carbon atoms, or no more than 9 carbon atoms, no more than 4 carbon atoms, no more than 3 carbon atoms, no more than 2 carbon atoms, or no more than 1 carbon atom. In some embodiments, the Z group can have no more than 4, no more than 3, no more than 2, no more than 1, or no oxygen atoms. In these perfluoropolyether structures, the different repeat units can be distributed randomly along the chain.

$R_f$ can be monovalent or divalent. In some compounds where $R_f$ is monovalent, the terminal groups can be (C$_p$F$_{2p+1}$)—, (C$_p$F$_{2p+1}$O)—, (X'C$_p$F$_{2p}$O)—, or (X'C$_p$F$_{2p+1}$)— where X' is hydrogen, chlorine, or bromine and p is an integer of 1 to 10. In some embodiments of monovalent $R_f$ groups, the terminal group is perfluorinated and p is an integer of 1 to 10, 1 to 8, 1 to 6, 1 to 4, or 1 to 3. Exemplary monovalent $R_f$ groups include CF$_3$O(C$_2$F$_4$O)$_n$CF$_2$—, C$_3$F$_7$O(CF$_2$CF$_2$CF$_2$O)$_n$CF$_2$CF$_2$—, and C$_3$F$_7$O(CF(CF$_3$)CF$_2$O)$_n$CF(CF$_3$)— wherein n has an average value of 0 to 50, 1 to 50, 3 to 30, 3 to 15, or 3 to 10.

Suitable structures for divalent $R_f$ groups include, but are not limited to, —CF$_2$O(CF$_2$O)$_q$(C$_2$F$_4$O)$_n$CF$_2$—, —(CF$_2$)$_3$O(C$_4$F$_8$O)$_n$(CF$_2$)$_3$—, —CF$_2$O(C$_2$F$_4$O)$_n$CF$_2$—, —CF$_2$ CF$_2$O(CF$_2$CF$_2$CF$_2$O)$_n$CF$_2$CF$_2$—, and —CF(CF$_3$)(OCF$_2$CF(CF$_3$))$_s$OC$_r$F$_{2t}$O(CF(CF$_3$)CF$_2$O)$_n$CF(CF$_3$)—, wherein q has an average value of 0 to 50, 1 to 50, 3 to 30, 3 to 15, or 3 to 10; n has an average value of 0 to 50, 3 to 30, 3 to 15, or 3 to 10; s has an average value of 0 to 50, 1 to 50, 3 to 30, 3 to 15, or 3 to 10; the sum (n+s) has an average value of 0 to 50 or 4 to 40; the sum (q+n) is greater than 0; and t is an integer of 2 to 6.

As synthesized, compounds according to Formula (1) typically include a mixture of $R_f$ groups. The average structure is the structure averaged over the mixture components. The values of q, n, and s in these average structures can vary, as long as the compound has a number average molecular weight of at least about 400. Compounds of Formula (1) often have a molecular weight (number average) of 400 to 5000, 800 to 4000, or 1000 to 3000.

The linking group W between the perfluoropolyether segment and (meth)acryl or —COCF=CH$_2$ endgroup includes a divalent or higher valency group selected from an alkylene, arylene, heteroalkylene, or combinations thereof and an optional divalent group selected from carbonyl, ester, amide, sulfonamido, or combinations thereof. W can be unsubstituted or substituted with an alkyl, aryl, halo, or combinations thereof. The W group typically has no more than 30 carbon atoms. In some compounds, the W group has no more than 20 carbon atoms, no more than 10 carbon atoms, no more than 6 carbon atoms, or no more than 4 carbon atoms. For example, W can be an alkylene, an alkylene substituted with an aryl group, or an alkylene in combination with an arylene or an alkyl ether or alkyl thioether linking group.

Perfluoropolyether acrylate compounds can be synthesized by known techniques such as described in U.S. Pat. Nos. 3,553,179 and 3,544,537 as well as U.S. Patent Application Publication No. 2004/0077775.

In some embodiments, the perfluoropolyether group comprises an "HFPO-" end group, i.e. the end group $F(CF(CF_3)CF_2O)_aCF(CF_3)$— (of the methyl ester $F(CF(CF_3)CF_2O)_aCF(CF_3)C(O)OCH_3$) wherein "a" averages 2 to 15. In some embodiments, a averages between 3 and 10 or a averages between 5 and 8. Such compound generally exist as a distribution or mixture of oligomers with a range of values for a, so that the average value of a may be non-integer. In one embodiment, a averages about 6.2.

The low refractive index composition preferably comprises various monofunctional and/or multi-functional HFPO- perfluoropolyether compounds as component i) and/or ii). The inclusion of at least about 5 wt-% to about 10 wt-%, low surface energy surfaces can be provided having an initial static contact angel with water of at least 110°.

Various perfluoropolyether mono-(meth)acrylate compounds are also known. One such exemplary low refractive index material is HFPO—$C(O)NHCH_2CH_2OC(O)CH=CH_2$, calculated to have 62.5 wt-% F. Other low refractive index perfluoropolyether mono-(meth)acrylate compounds that can be prepared in a similar manner are HFPO—$C(O)NHCH_2CH_2OCH_2CH_2OCH_2CH_2OC(O)CH=CH_2$ calculated to have 59.1 wt-% F, HFPO—$C(O)NH(CH_2)_6OC(O)CH=CH_2$ calculated to have 60.2 wt-% F, and $HFPOC(O)NHCH_2CH_2OCH_2CH_2OCH_2CH_2OCH_2CH_2OC(O)CH=CH_2$ calculated to have 57.3 wt-% F. Such compounds are described in U.S. patent application Ser. No. 11/277,162 filed Mar. 22, 2006 (See preparations 31a-31d).

An exemplary low refractive index perfluoropolyether multi-(meth)acrylate monomer is HFPO—$C(O)N(H)CH_2CH(OC(O)CH=CH_2)CH_2OC(O)CH=CH_2$, calculated to have a fluorine content of 53.4%. This monomer can be prepared as described as described in U.S. Patent Application Publication No. 2005/0249940-A1. (See FC-4). Other low refractive index multi-(meth)acrylate perfluoropolyether compounds include $H_2C=CHC(O)OCH_2CH_2N(H)(O)C$—HFPO—$C(O)N(H)CH_2CH_2OC(O)CH=CH_2$, having 58.1% fluorine and $(H_2C=CHC(O)OCH_2)_2CH_3CH_2CN(H)(O)C$-$HFPOC(O)N(H)CCH_2CH_3(CH_2OC(O)CH=CH_2)_2$ having 50.1% fluorine. These compounds can be prepared as described in the U.S. patent application Ser. No. 11/087,413, filed Mar. 23, 2005 and Pending U.S. application Ser. No. 11/277,162, filed Mar. 22, 2006 (See Preparations No. 28. and 30). Another preferred high fluorine containing material is a (e.g. perfluoropolyether) acrylate oligomer reported by the supplier to have a refractive index of 1.341 commercially available from Sartomer under the trade designation "CN4000". In view of the low refractive index, this material is believed to have a fluorine content of at least about 50 wt-%. Based on NMR analysis, CN4000 has a molecular weight (Mn) of about 1300 g/mole.

Other low refractive index fluoropolyether multi-(meth) acrylate compounds are described in U.S. Pat. Nos. 3,810,874 and 4,321,404. A representative compound is given by the structure $CH_2=CHC(O)OCH_2CF_2O(CF_2CF_2O)_{mm}(CF_2O)_{nn}CH_2OC(O)CH=CH_2$, where mm and nn designate that the number of randomly distributed perfluoroethyleneoxy and perfluoromethyleneoxy backbone repeating units, respectively, mm and nn having independently values, for example from 1 to 50, and the ratio of mm/nn is 0.2 to 1 to 5/1.

Another high fluorine containing multi-functional free-radically polymerizable material is a perfluoropolyether multi-(meth)acryl compound preparable by Michael-type addition of a reactive (per)fluoropolyether with a poly(meth) acrylate. Such compounds are further described in US Publication No. 2005/0250921A1. An exemplary Michael adduct having a high fluorine content is the adduct of HFPO—$C(O)N(H)CH_2CH_2CH_2N(H)CH_3$ with trimethylolpropane triacrylate (TMPTA), having a fluorine content of 52.02 wt-%.

Other commercially available low refractive index perfluoropolyether compounds include a perfluoropolyether caprolactone diacrylate compound, available from Cytonix Corporation, Beltsville, Md., under the trade designation "FluorN 1939A" and perfluoropolyether glycol diacrylate, also available from Cytonix Corporation under the trade designation "FluorN 1970A"

Other high fluorine perfluoropolyether (meth)acrylate from can be prepared by reaction of a commercially available perfluoropolyether compounds (such as available from Solvay Solexis under the trade designation "Fomblin Zdol 2000") with acryloyl chloride using methods described in Example 15 of U.S. Pat. No. 3,810,874.

Various perfluoroalkyl multi-(meth)acrylates are known. Various commercially available low refractive index species are described in Table 1 as follows:

TABLE 1

| Chemical Description | Supplier (Location) | Wt-% Fluorine |
|---|---|---|
| 2,2,3,3,4,4,5,5-octafluorohexane-1,6-diacrylate | Exfluor Research Corp., Round Rock, TX | 41.06 |
| 2,2,3,3,4,4,5,5-octafluoro hexane-1,6-dimethacrylate | Exfluor Research Corp. | 38.16 |
| 2,2,3,3-tetrafluorobutane-1,4-diacrylate | Oakwood Products Inc., West Columbia, SC | 28.13 |
| 2,2,3,3-tetrafluorobutane-1,4-dimethacrylate | Oakwood Products Inc. | 25.49 |
| fluorinated tetraethylene glycol diacrylate | Oakwood Products Inc. | |
| 2,2,3,3,4,4-hexafluoropentane-1,5-diacrylate | SynQuest Laboratories, Inc. Alachua, FL | 35.6 |

Other low refractive index perfluoroalkyl multi-(meth) acrylate compounds can be synthesized. For example, $C_4F_9SO_2N(C_2H_4OC(O)CH=CH_2)_2$ (568 g/mole molecular weight and a fluorine content of 30.11%) and $C_4F_9SO_2N(C_2H_4OC(O)C(CH_3)=CH_2)_2$ (596 molecular weight and a fluorine content of 28.69%) can be synthesized by first preparing the fluorochemical diol FBSEE $(C_4F_9SO_2N(C_2H_4OH)_2)$ as described in column 5, line 31 and in FIG. 9 of U.S. Pat. No. 3,734,962 (1973) and then preparing the acrylate derivative by the method described in Example 2B of WO 01/30873 to Savu et al.

The composition can optionally include various fluorinated mono(meth)acrylate materials such as described in Gaynor et al. Journal of Applied Polymer Science 1993, vol 50, p. 1645 and Taka et al, *Macromolecules*, 1992, vol 25, p. 6563. The fluorinated mono(meth)acrylate may have the general structure Rf—$CH_2O$—$C(O)$—$C(X)=CH_2$ wherein X is H, F, $CH_3$, and Rf is fluoroalkyl or fluoroalkylene. Fluoropolymer materials used in the low index coating may be described by broadly categorizing them into one of two basic classes. A first class includes those amorphous fluoropolymers comprising interpolymerized units derived from vinylidene fluoride (VDF) and hexafluoropropylene (HFP) and optionally tetrafluoroethylene (TFE) monomers. Examples of such are commercially available from 3M Company as Dyneon™ Fluoroelastomer FC 2145 and FT 2430. Additional amorphous fluoropolymers contemplated by this invention are for example VDF-chlorotrifluoroethylene copolymers, commercially known as Kel-F™ 3700, available from 3M Company. As used herein, amorphous fluoropolymers are materials that contain essentially no crystallinity or possess no significant melting point as determined for example by differential scanning caloriometry (DSC). For the purpose of this discussion, a copolymer is defined as a polymeric material resulting from the simultaneous polymerization of two or more dissimilar monomers and a homopolymer is a polymeric material resulting from the polymerization of a single monomer.

The second significant class of fluoropolymers useful in this invention are those homo and copolymers based on fluorinated monomers such as TFE or VDF which do contain a crystalline melting point such as polyvinylidene fluoride (PVDF, available commercially from 3M Company as Dyneon™ PVDF, or more preferable thermoplastic copolymers of TFE such as those based on the crystalline microstructure of TFE-HFP-VDF. Examples of such polymers are those available from 3M under the trade name Dyneon™ Fluoroplastic THV® 200.

In some embodiments, i) comprises a free-radically polymerizable fluoropolymer. The use of free-radically polymerizable fluoropolymers as component i) improves the durability of the low refractive index surface layer. A general description and preparation of these classes of fluoropolymers can be found in Encyclopedia Chemical Technology, *Fluorocarbon Elastomers*, Kirk-Othmer (1993), or in *Modern Fluoropolymers*, J. Scheirs Ed, (1997), J Wiley Science, Chapters 2, 13, and 32. (ISBN 0-471-97055-7).

Preferred fluoropolymers are formed from the constituent monomers known as tetrafluoroethylene ("TFE"), hexafluoropropylene ("HFP"), and vinylidene fluoride ("VDF," "VF2,"). The monomer structures for these constituents are shown below:

TFE: $CF_2=CF_2$ (1)

VDF: $CH_2=CF_2$ (2)

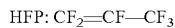

HFP: $CF_2=CF-CF_3$ (3)

The fluoropolymers preferably comprise at least two of the constituent monomers (HFP and VDF), and more preferably all three of the constituents monomers in varying molar amounts. Additional monomers not depicted in (1), (2) or (3) but also useful include perfluorovinyl ether monomers of the general structure $CF_2=CF-OR_f$, wherein $R_f$ can be a branched or linear perfluoroalkyl radicals of 1-8 carbons and can itself contain additional heteroatoms such as oxygen. Specific examples are perfluoromethyl vinyl ether, perfluoropropyl vinyl ethers, perfluoro(3-methoxy-propyl)vinyl ether. Additional examples are found in Worm (WO 00/12574), assigned to 3M, and in Carlson (U.S. Pat. No. 5,214,100).

Amorphous copolymers consisting of VDF-HFP and optionally TFE are hereinafter referred to as FKM, or FKM elastomers as denoted in ASTM D 1418. FKM elastomers have the general formula:

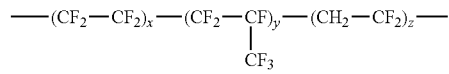

wherein x, y and z are expressed as molar percentages. In some embodiments, x can be zero so long as the molar percentage of y is sufficiently high (typically greater than about 18 molar percent) to render the microstructure amorphous. Additional fluoroelastomer compositions useful in the present invention exist where x is greater than zero.

The fluoropolymer comprises free-radically polymerizable groups. Preferably this is accomplished by the inclusion of halogen-containing cure site monomers ("CSM") and/or halogenated endgroups, which are interpolymerized into the polymer using numerous techniques known in the art. These halogen groups provide reactivity towards the other components of coating mixture and facilitate the formation of the polymer network. Useful halogen-containing monomers are well known in the art and typical examples are found in U.S. Pat. No. 4,214,060 to Apotheker et al., European Patent No. EP398241 to Moore, and European Patent No. EP407937B1 to Vincenzo et al.

Optionally halogen cure sites can be introduced into the polymer structure via the use of halogenated chain transfer agents which produce fluoropolymer chain ends that contain reactive halogen endgroups. Such chain transfer agents ("CTA") are well known in the literature and typical examples are: $Br-CF_2CF_2-Br$, $CF_2Br_2$, $CF_2I_2$, $CH_2I_2$. Other typical examples are found in U.S. Pat. No. 4,000,356 to Weisgerber. Whether the halogen is incorporated into the polymer microstructure by means of a cure site monomer or chain transfer agent or both is not particularly relevant as both result in a fluoropolymer which is more reactive towards UV crosslinking and coreaction with other components of the network such as the acrylates. An advantage to use of cure site monomers in forming the co-crosslinked network, as opposed to a dehydrofluorination approach (discussed below), is that the optical clarity of the formed polymer layer is not compromised since the reaction of the acrylate and the fluoropolymer does not rely on unsaturation in the polymer backbone in order to react. Thus, a bromo-containing fluoroelastomer such as Dyneon™ E-15742, E-18905, or E-18402 available from Dyneon LLC of St. Paul, Minn., may be used in conjunction with, or in place of, FKM as the fluoropolymer.

In another embodiment, the fluoropolymer can be rendered reactive by dehydrofluorinated by any method that will provide sufficient carbon-carbon unsaturation of the fluoropolymer to create increased bond strength between the fluoropolymer and a hydrocarbon substrate or layer. The dehydrofluorination process is a well-known process to induced unsaturation and it is used most commonly for the ionic crosslinking of fluoroelastomers by nucleophiles such as diphenols and diamines. This reaction is characteristic of VDF containing elastomers. A descriptions can be found in *The Chemistry of Fluorocarbon Elastomer*, A. L. *Logothetis, Prog. Polymer Science* (1989), 14, 251. Furthermore, such a reaction is also possible with primary and secondary aliphatic monofunctional amines and will produce a DHF-fluoropolymer with a pendent amine side group. However, such a DHF reaction is not possible in polymers which do not contain VDF units since they lack the ability to lose HF by such reagents.

Combinations of fluoropolymers rendered reactive by inclusion of a cure site monomer and fluoropolymers rendered reactive by dehydrofluorination can by employed. The fluoropolymer containing low refractive index composition described herein preferably comprise at least one amino organosilane ester coupling agent or a condensation product thereof as described in Ser. No. 11/026,640, filed Dec. 30, 2004; incorporated herein by reference. Preferred amino organosilane ester coupling agent include 3-aminopropyltrimethoxysilane, 3-aminopropyltriethoxysilane, (aminoethylaminomethyl)phenethyltrimethoxysilane, (aminoethylaminomethyl)phenethyltriethoxysilane, N-(2-aminoethyl)-3-aminopropylmethyldimethoxysilane, N-(2-aminoethyl)-3-aminopropylmethyldiethoxysilane, N-(2-aminoethyl)-3-aminopropyltrimethoxysilane, N-(2-aminoethyl)-3-aminopropyltriethoxysilane, 4-aminobutyltrimethoxysilane, 4-aminobutyltriethoxysilane, 3-aminopropylmethyldiethoxysilane, 3-aminopropylmethyldimethoxysilane, 3-aminopropyldimethylmethoxysilane, 3-aminopropyldimethylethoxysilane, 2,2-dimethoxy-1-aza-2-silacyclopentane-1-ethanamine, 2,2-diethoxy-1-aza-2-silacyclopentane-1-ethanamine, 2,2-diethoxy-1-aza-2-silacyclopentane, 2,2-dimethoxy-1-aza-2-silacyclopentane, 4-aminophenyltrimethoxy silane, and 3-phenylaminopropyltrimethoxy silane.

In other embodiments, the low refractive index composition (e.g. suitable for photolithography) may comprise fluoropolymers that do not comprise cure site monomers.

For example crystalline terpolymers of TFE, VDF, and HFP (referred to as THV) may be employed. One commercially available form of THV is Dyneon™ Fluorothermoplastic THV™ 220, a polymer that is manufactured by Dyneon LLC, of St. Paul, Minn. Other useful fluorothermoplastics are commercially available, for example, from Dyneon LLC, St. Paul, Minn. under the trade names THV™ 200, THV™ 500, and THV™ 800. THV™ 200 is preferred since it is readily soluble in common organic solvents such as MEK and this facilitates coating and processing.

Other fluoroplastic materials include for example, PVDF-containing fluoroplastic materials having very low molar levels of HFP sold under the trade name Dyneon™ PVDF 6010 or 3100, available from Dyneon LLC, of St. Paul, Minn.; and Kynar™ 740, 2800, 9301, available from Elf Atochem North America Inc. Further, other fluoroplastic materials are specifically contemplated wherein x is zero and wherein y is between about 0 and 18 percent. Optionally, the microstructure shown above can also contain additional non-fluorinated monomers such as ethylene, propylene, or butylene. Examples of which are commercially available as Dyneon™ ETFE and Dyneon™ HTE fluoroplastics.

One example of a commercially available elastomeric fluoropolymer is available from Dyneon LLC, St. Paul, Minn., under the trade name Dyneon™ Fluoroelastomer FC 2145. Another example of a commercially available elastomeric fluoropolymer is available from Dyneon LLC, St. Paul, Minn., and is sold under the trade name Dyneon™ Fluoroelastomer FT 2430. Examples of propylene-containing fluoroelastomers known as base resistant elastomers ("BRE") and are commercially available from Dyneon under the trade name Dyneon™ BRE 7200 available from 3M Company of St. Paul, Minn. Another example is a TFE-propylene copolymer available under the tradename Aflaf™ from Asahi Glass Company of Charlotte, N.C.

Various fluoropolyether urethane (meth)acrylate material(s) can be employed in low index composition of the invention as component i) or ii).

Various suitable perfluoropolyether compounds are described in U.S. patent application Ser. No. 11/087,413, filed Mar. 23, 2005 and Pending U.S. application Ser. No. 11/277,162, filed Mar. 22, 2006; incorporated herein by reference. Such materials generally include at least one polymerizable (e.g. terminal) (meth)acrylate moiety and at least one (optionally repeating) unit including a (per)fluoropolyether group bonded by means of a linking group, having a valency of at least two, to a urethane or urea linkage. The urethane and urea linkage is typically —NHC(O)X— wherein X is O, S or NR; and R is H or an alkyl group having 1 to 4 carbon. The perfluoropolyether moiety is preferably a HFPO— moiety, as previously described.

In one aspect, the fluoropolyether urethane (meth)acrylate can be represented by

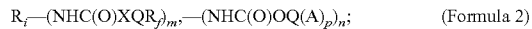

$$R_i-(NHC(O)XQR_f)_m-(NHC(O)OQ(A)_p)_n; \quad \text{(Formula 2)}$$

wherein $R_i$ is the residue of a multi-isocyanate;

X is O, S or NR, wherein R is H or an alkyl group having 1 to 4 carbon;

$R_f$ is a monovalent perfluoropolyether moiety comprising groups of the formula $F(R_{fc}O)_xC_dF_{2d}$—, wherein each $R_{fc}$ is independently a fluorinated alkylene group having from 1 to 6 carbon atoms, each x is an integer greater than or equal to 2, and wherein d is an integer from 1 to 6;

each Q is independently a connecting group having a valency of at least 2;

A is a (meth)acryl functional group —XC(O)C($R_2$)=CH$_2$ wherein $R_2$ is an alkyl group of 1 to 4 carbon atoms or H or F;

m is at least 1; n is at least 1; p is 2 to 6; m+n is 2 to 10; wherein each group having subscripts m and n is attached to the $R_i$ unit.

Q can be a straight or branched chain or cycle-containing connecting group. Q can include a covalent bond, an alkylene, an arylene, an aralkylene, an alkarylene. Q can optionally include heteroatoms such as O, N, and S, and combinations thereof. Q can also optionally include a heteroatom-containing functional group such as carbonyl or sulfonyl, and combinations thereof.

An exemplary material is

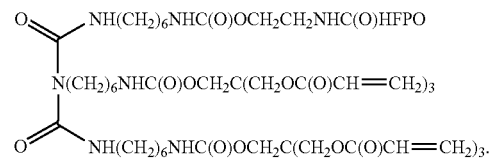

In another aspect, the fluoropolyether urethane (meth) acrylate can be represent by

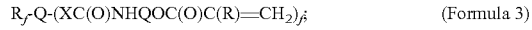

$$R_f\text{-}Q\text{-}(XC(O)NHQOC(O)C(R)=CH_2)_f; \quad \text{(Formula 3)}$$

wherein $R_f$ is a monovalent perfluoropolyether moiety comprising groups of the formula $F(R_{fc}O)_xC_dF_{2d}$—, wherein each $R_{fc}$ is independently a fluorinated alkylene group having 1 to 6 carbon atoms, each x is an integer greater than or equal to 2, and d is an integer from 1 to 6;

a is 2-15;

each Q is independently a connecting group having a valency of at least 2;

X is O or S; and wherein f is at least 1 or 2 and no greater than 5.

Exemplary materials include $F(CF(CF_3)CF_2O)_aCF(CF_3)$—$C(O)NHC(C_2H_5)(CH_2OC(O)NHC_2H_4OC(O)C(CH_3)=CH_2)_2$ wherein a ranges from 4 to 15,
and HFPO—C(O)NHC$_2$H$_4$OC(O)NHC$_2$H$_4$OC(O)C(CH$_3$)=CH$_2$.

In another aspect, the fluoropolyether urethane (meth)acrylate can be represent by

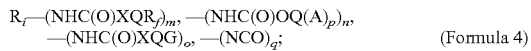
$$R_i\text{—(NHC(O)XQR}_f)_m\text{, —(NHC(O)OQ(A)}_p)_n,$$
$$\text{—(NHC(O)XQG)}_o\text{, —(NCO)}_q; \qquad \text{(Formula 4)}$$

wherein
R$_i$ is a residue of a multi-isocyanate;
X is O, S or NR, wherein R is H or an alkyl group having 1 to 4 carbon atoms;
R$_f$ is a monovalent perfluoropolyether moiety comprising groups of the formula:
F(R$_{fc}$O)$_x$C$_d$F$_{2d}$—, wherein each R$_{fc}$ is a fluorinated alkylene group having from 1 to 6 carbon atoms, each x is an integer greater than or equal to 2, and d is an integer from 1 to 6;
Q is independently a connecting group of valency at least 2;
G is selected from the group consisting of alkyl, aryl, alkaryl and aralkyl;
where m is at least 1;
where n is at least 1;
where o is at least 1;
where p is 2 to 6; and
where q is 0 or greater.
wherein G contains heteroatoms selected from O, N, S, and combinations thereof and optionally a heteroatom-containing functional group selected from carbonyl, sulfonyl, and combinations thereof.

G may contain pendant or terminal reactive groups selected from the group consisting of (meth)acryl groups, vinyl groups, allyl groups, and —Si(OR$_3$)$_3$ groups, wherein R$_3$ is an alkyl group having 1 to 4 carbon atoms. G preferably contains fluoroalkyl or perfluoroalkyl groups.

In another aspect, the fluoropolyether urethane (meth)acrylate can be represent by

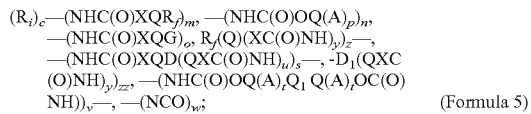
$$(R_i)_c\text{—(NHC(O)XQR}_f)_m\text{, —(NHC(O)OQ(A)}_p)_n,$$
$$\text{—(NHC(O)XQG)}_o\text{, R}_f\text{(Q)(XC(O)NH)}_z\text{—,}$$
$$\text{—(NHC(O)XQD(QXC(O)NH)}_u)_s\text{—, -D}_1\text{(QXC(O)NH)}_y)_{zz}\text{, —(NHC(O)OQ(A)}_rQ_1Q(A)_tOC(O)NH))_v\text{—, —(NCO)}_w; \qquad \text{(Formula 5)}$$

wherein
R$_i$ is a residue of a multi-isocyanate;
c is 1 to 50;
X is O, S or NR, where R is H or an alkyl group comprising 1 to 4 carbon atoms;
R$_f$ is a monovalent perfluoropolyether moiety comprising groups of the formula F(R$_{fc}$O)$_x$C$_d$F$_{2d}$, wherein each R$_{fc}$ independently represents a fluorinated alkylene group having from 1 to 6 carbon atoms, each x is an integer greater than or equal to 2, and d is an integer from 1 to 6;
Q and Q$_1$ are each independently a connecting group of valency at least 2;
A is a (meth)acryl functional group having the formula (—XC(O)C(R$_2$)=CH$_2$), wherein R$_2$ is an alkyl group having 1 to 4 carbon atoms or H or F;
G is selected from the group consisting of alkyl, aryl, alkaryl and aralkyl;
D is selected from the group consisting of alkylene, arylene, alkarylene, fluoroalkylene, perfluoroalkylene, and aralkylene; optionally containing heteroatoms selected from O, N, and S;
D$_1$ is selected from the group consisting of alkyl, aryl, alkaryl, fluoroalkyl, perfluoroalkyl, and aralkyl, each group optionally containing heteroatoms selected from O, N, and S;
m or z is at least 1;
n or v is at least 1;
o, s, v, and w are 0 or greater;
and at least one of s, v, z, or zz is 1.

In another aspect, the fluoropolyether urethane (meth)acrylate can be represent by

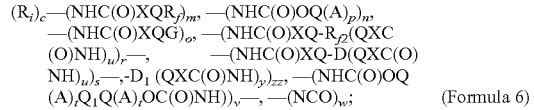
$$(R_i)_c\text{—(NHC(O)XQR}_f)_m\text{, —(NHC(O)OQ(A)}_p)_n,$$
$$\text{—(NHC(O)XQG)}_o\text{, —(NHC(O)XQ-R}_{f2}\text{(QXC(O)NH)}_u)_r\text{—, —(NHC(O)XQ-D(QXC(O)NH)}_u)_s\text{—, -D}_1\text{(QXC(O)NH)}_y)_{zz}\text{, —(NHC(O)OQ(A)}_tQ_1Q(A)_rOC(O)NH))_v\text{—, —(NCO)}_w; \qquad \text{(Formula 6)}$$

wherein
R$_i$ is a residue of a multi-isocyanate;
c is 1 to 50;
X is O, S or NR, where R is H or an alkyl group comprising 1 to 4 carbon atoms;
R$_f$ is a monovalent perfluoropolyether moiety comprising groups of the formula F(R$_{fc}$O)$_x$C$_d$F$_{2d}$—, wherein each R$_{fc}$ is independently a fluorinated alkylene group having 1 to 6 carbon atoms, each x is an integer greater than or equal to 2, and d is an integer from 1 to 6;
Q and Q$_1$ are each independently a connecting group of valency at least 2;
A is a (meth)acryl functional group having the formula (—XC(O)C(R$_2$)=CH$_2$), wherein R$_2$ is an alkyl group having 1 to 4 carbon atoms or H or F;
G is selected from the group consisting of alkyl, aryl, alkaryl and aralkyl;
R$_{f2}$ is a multi-valent perfluoropolyether moiety having the formula Y((R$_{fc1}$O)$_x$C$_{d1}$F$_{2d}$)$_b$, wherein each R$_{fc1}$ is independently selected from: —CF(CF$_3$)CF$_2$—, —CF$_2$CF$_2$CF$_2$—, and (CH$_2$C(CH$_3$)(CH$_2$OCH$_2$CF$_3$)CH$_2$—)$_{aa}$ where aa is 2 or greater; each x is independently an integer greater than or equal to 2, d1 is an integer from 0 to 6; Y represents a polyvalent organic group or covalent bond having a valence of b, and b represents an integer greater than or equal to 2;
D is selected from the group consisting of alkylene, arylene, alkarylene, fluoroalkylene, perfluoroalkylene and aralkylene; optionally contains heteroatoms such as O, N, and S;
D$_1$ is selected from the group consisting of alkyl, aryl, alkaryl, fluoroalkyl, perfluoroalkyl, and aralkyl, each group containing heteroatoms selected from O, N, and S;
where r is at least 1;
where n or v is at least 1; and
where m, o, s, v, and w are 0 or greater.

For each of the fluoropolyether urethane (meth)acrylates of Formulas 2-6), when X is O, Q is typically not methylene and thus contains two or more carbon atoms. In some embodiments, X is S or NR. In some embodiments, Q is an alkylene having at least two carbon atoms. In other embodiments, Q is a straight chain, branched chain, or cycle-containing connecting group selected from arylene, aralkylene, and alkarylene. In yet other embodiments, Q is a straight chain, branched chain, or cycle-containing connecting group containing a heteroatom such as O, N, and S and/or a heteroatom containing functional groups such as carbonyl and sulfonyl. In other embodiments, Q is a branched or cycle-containing alkylene group that optionally contains heteroatoms selected from O, N, S and/or a heteroatom-containing functional group such as carbonyl and sulfonyl. In some embodiments Q contains a nitrogen containing group such as amide.

Typically, the fluoropolyether urethane (meth)acrylates are made by first reacting the polyisocyanate with the perfluoropolyether-containing alcohol, thiol, or amine, followed by reaction with the hydroxyl functional multiacrylate, usually in a non-hydroxylic solvent and in the presence of a catalyst such as an organotin compound. Alternatively, the additives of this preferred embodiment are made by reacting the polyisocyanate with the hydroxyl functional multiacrylate, followed by reaction with the perfluoropolyether-containing alcohol, thiol, or amine, usually in a non-hydroxylic solvent and in the presence of a catalyst such as an organotin compound. In addition, the additives could be made by reacting all three components simultaneously, usually in a non-hydroxylic solvent and in the presence of a catalyst such as an organotin compound.

In some embodiments, perfluoropolyether urethane compounds are employed as the high fluorine containing material. Low refractive index multi-(meth)acrylate perfluoropolyether urethane compounds include $H_2C=CHC(O)OCH_2CH_2N(H)(O)C$-HFPO—$C(O)N(H)CH_2CH_2OC(O)CH=CH_2$, having 58.1% fluorine, and $(H_2C=CHC(OOCH_2)_2CH_3CH_2CN(H)(O)CHFPOC(O)N(H)CCH_2CH_3(CH_2OC(O)CH=CH_2)_2$ having 50.1% fluorine. These compounds can be prepared as described Preparations No. 28. and 30 of the '413 patent applications previously described. The fluoropolyether moiety of the low refractive index (meth)acrylate perfluoropolyether is preferably a HFPO moiety.

The low refractive index composition typically comprises at least one crosslinker having three or more (meth)acrylate groups. This component is typically a non-fluorinated multi-(meth)acrylate monomer. The amount of non-fluorinated multi-(meth)acrylate monomer typically ranges from 5 wt-% to about 90 wt-% of the organic components of the low refractive index coatings. For embodiments wherein the composition further comprises surface modified inorganic nanoparticles, the low refractive index composition may comprises about 5 wt-% to about 30 wt-% of crosslinker. However, in the absence of surface modified inorganic nanoparticles the low refractive index composition typically comprises greater than 40 wt-% and more typically greater than 50 wt-% crosslinker.

Suitable monomers include for example trimethylolpropane triacrylate (commercially available from Sartomer Company, Exton, Pa. under the trade designation "SR351") ethoxylated trimethylolpropane triacrylate (commercially available from Sartomer Company, Exton, Pa. under the trade designation "SR454"), pentaerythritol tetraacrylate, pentaerythritol triacrylate (commercially available from Sartomer under the trade designation "SR444"), dipentaerythritol pentaacrylate (commercially available from Sartomer under the trade designation "SR339LV"), ethoxylated pentaerythritol tetraacrylate, ethoxylated pentaerythritol triacrylate (from Sartomer under the trade designation "SR494") and dipentaerythritol hexaacrylate. In some aspects, a hydantoin moiety-containing multi-(meth)acrylates compound is employed, such as described in U.S. Pat. No. 4,262,072 (Wendling et al.).

The low refractive index composition may include one or more difunctional (meth)acrylate monomers. Various difunctional (meth)acrylate monomer are known in the art, including for example 1,3-butylene glycol diacrylate, 1,4-butanediol diacrylate, 1,6-hexanediol diacrylate, 1,6-hexanediol monoacrylate monomethacrylate, ethylene glycol diacrylate, alkoxylated aliphatic diacrylate, alkoxylated cyclohexane dimethanol diacrylate, alkoxylated hexanediol diacrylate, alkoxylated neopentyl glycol diacrylate, caprolactone modified neopentylglycol hydroxypivalate diacrylate, caprolactone modified neopentylglycol hydroxypivalate diacrylate, cyclohexanedimethanol diacrylate, diethylene glycol diacrylate, dipropylene glycol diacrylate, ethoxylated bisphenol A diacrylate, neopentyl glycol diacrylate, polyethylene glycol diacrylate, (Mn=200 g/mole, 400 g/mole, 600 g/mole), propoxylated neopentyl glycol diacrylate, tetraethylene glycol diacrylate, tricyclodecanedimethanol diacrylate, triethylene glycol diacrylate, and tripropylene glycol diacrylate.

Small concentrations of oligomeric (meth)acrylate compounds such as for example, urethane acrylates, polyester acrylates, epoxy acrylates, and combinations thereof may optionally be employed.

The low refractive index composition typically provides at least one free-radical initiator. Useful free-radical thermal initiators include, for example, azo, peroxide, persulfate, and redox initiators, and combinations thereof. Useful free-radical photoinitiators include, for example, those known as useful in the UV cure of acrylate polymers. In addition, other additives may be added to the final composition. These include but are not limited to resinous flow aids, photostabilizers, high boiling point solvents, and other compatibilizers well known to those of skill in the art.

The low refractive index coating composition can be formed by dissolving the free-radically polymerizable material(s) having a fluorine content of at least about 25 wt-% and the fluoropolyether urethane (meth)acrylate material(s) in a compatible organic solvent at a concentration of about 1 to 10 percent solids. A single organic solvent or a blend of solvents can be employed in the preparation of the fluoro(meth)acrylate polymer (e.g. intermediate) and low refractive index composition. Depending on the free-radically polymerizable materials employed, suitable solvents include alcohols such as isopropyl alcohol (IPA) or ethanol; ketones such as methyl ethyl ketone (MEK), methyl isobutyl ketone (MIBK), diisobutyl ketone (DIBK); cyclohexanone, or acetone; aromatic hydrocarbons such as toluene; isophorone; butyrolactone; N-methylpyrrolidone; tetrahydrofuran; esters such as lactates, acetates, including propylene glycol monomethyl ether acetate such as commercially available from 3M under the trade designation "3M Scotchcal Thinner CGS10" ("CGS10"), 2-butoxyethyl acetate such as commercially available from 3M under the trade designation "3M Scotchcal Thinner CGS50" ("CGS50"), diethylene glycol ethyl ether acetate (DE acetate), ethylene glycol butyl ether acetate (EB acetate), dipropylene glycol monomethyl ether acetate (DPMA), iso-alkyl esters such as isohexyl acetate, isoheptyl acetate, isooctyl acetate, isononyl acetate, isodecyl acetate, isododecyl acetate, isotridecyl acetate or other iso-alkyl esters; combinations of these and the like.

Although various fluorinated solvents could be employed, in one aspect compatible coating compositions are prepared that are free of fluorinated solvents. Compatible coating compositions are clear, rather than hazy. Compatible coatings are substantially free of visual defects. Visual defects that may be observed when incompatible coating are employed include but are not limited to haze, pock marks, fisheyes, mottle, lumps or substantial waviness, or other visual indicators known to one of ordinary skill in the art in the optics and coating fields.

In some aspects, the cured coating is solvent repellent (i.e. a droplet of solvent remains in a bead rather than dissolving into the cured coating. The cured coating may be repellent to ketones (acetone, methyl ethyl ketone, cyclohexanone), esters (ethyl acetate), alcohols methanol ethanol, propanol and isopropanol) and ethers (THF). This aspect is preferred for photolithography.

The method of forming an antireflective coating on an optical display or an antireflective film for use of an optical display may include providing a light transmissible substrate layer; providing a high refractive index material on the substrate layer; and providing the low index layer described herein coupled to the high refractive index layer. The low index layer may be provided by applying a layer of said low refractive index material onto said (e.g. cured) layer of said high refractive index material and irradiating with a sufficient ultraviolet radiation to crosslink. Alternatively, the low refractive index coating may be applied to a release liner, at least partially cured, and transfer coated. Further, the antireflection material may be applied directly to the substrate or alternatively applied to a release layer of a transferable antireflection film and subsequently transferred from the release layer to the substrate using a thermal transfer or photoradiation application technique.

The low refractive index composition and high refractive index composition can be applied as a single or multiple layers to a high refractive index layer or directly to a (e.g. display surface or film) substrate using conventional film application techniques. Alternatively, the low refractive index coating may be applied to a release liner or substrate, at least partially cured, and transfer coated using a thermal transfer or photoradiation application technique. Although it is usually convenient for the substrate to be in the form of a roll of continuous web, the coatings may be applied to individual sheets.

Thin films can be applied using a variety of techniques, including dip coating, forward and reverse roll coating, wire wound rod coating, and die coating. Die coaters include knife coaters, slot coaters, slide coaters, fluid bearing coaters, slide curtain coaters, drop die curtain coaters, and extrusion coaters among others. Many types of die coaters are described in the literature such as by Edward Cohen and Edgar Gutoff, *Modern Coating and Drying Technology*, VCH Publishers, NY 1992, ISBN 3-527-28246-7 and Gutoff and Cohen, *Coating and Drying Defects: Troubleshooting Operating Problems*, Wiley Interscience, NY ISBN 0-471-59810-0.

The low refractive index as well as high refractive index coating composition are dried in an oven to remove the solvent and then cured for example by exposure ultraviolet radiation using an H-bulb or other lamp at a desired wavelength, preferably in an inert atmosphere (less than 50 parts per million oxygen). The reaction mechanism causes the free-radically polymerizable materials to crosslink.

The fluorinated component(s) of the low refractive index layer provide low surface energy. The surface energy of the low index coating composition can be characterized by various methods such as contact angle. The static contact angle with water of the cured low refractive index layer is typically at least 70 degrees. More preferably, the contact angle is at least 80 degrees and most preferably at least 90 degrees. Alternatively, or in addition thereto, the advancing contact angle with hexadecane is at least 50 degrees and more preferably at least 60 degrees. Low surface energy results in anti-soiling and stain repellent properties as well as rendering the exposed surface easy to clean.

The low refractive index composition described herein is amenable to providing a durable low refractive index layer and antireflective films. In one aspect, the durable low refractive index layer or antireflective film are free of scratches visible to the eye after 10 wipes, 50 wipes, 100 wipes, 200 wipes, and even 300 wipes with steel wool using a 3.2 cm diameter mandrel and a mass of 500 grams as measured according to the Steel Wool Durability Test, described in further detail in the examples.

Surface layers that resist visible scratching do not necessarily retain their low surface energy. In preferred embodiments, the durable low refractive index layers and durable antireflective films retain low surface energy after repeated contact with an abrasive material such as steel wool. The low refractive index layer and antireflective film preferably exhibits substantially the same ink repellency or a static contact angle with water of at least 90°, 95°, or 100° after various wipes according to the Steel Wool Durability Test.

In some embodiments, durable antireflective film include the low refractive index layer prepared from the free-radically polymerizable polymeric intermediate as described herein in combination with a high refractive index layer that consists of a (e.g. single) thin layer of an inorganic material, such as a metal or metal oxide. Such high refractive index coatings are generally deposited by thermal evaporation, sputtering, or other vacuum deposition techniques. Examples of particular metal oxides include for example oxides of aluminum, silicon, tin, titanium, niobium, zinc, zirconium, tantalum, yttrium, cerium, tungsten, bismuth, indium, and mixtures thereof.

Durable low refractive index layer preferably comprises (e.g. surface modified) particles preferably having a low refractive index (e.g. less than 1.50) dispersed in the free-radically polymerized fluoro-organic material described herein. Various low refractive index inorganic oxides particles are known such as metal oxides, metal nitrides, and metal halides (e.g. fluorides). Preferred low refractive index particle include colloidal silica, magnesium fluoride, and lithium fluoride. Silicas for use in the low refractive index composition are commercially available from Nalco Chemical Co., Naperville, Ill. under the trade designation "Nalco Collodial Silicas" such as products 1040, 1042, 1050, 1060, 2327 and 2329. Suitable fumed silicas include for example, products commercially available from DeGussa AG, (Hanau, Germany) under the trade designation, "Aerosil series OX-50", as well as product numbers-130, -150, and -200. Fumed silicas are also commercially available from Cabot Corp., Tuscola, I, under the trade designations CAB-O-SPERSE 2095", "CAB-O-SPERSE A105", and "CAB-O-SIL M5".

The high refractive index layer of the durable antireflective film preferably comprises (e.g. surface modified) particles preferably having a high refractive index (e.g. at least 1.60) dispersed in a crosslinked organic material. A variety of (e.g. non-fluorinated) free-radically polymerizable monomers, oligomers, polymers, and mixtures thereof can be employed in the organic material of the high refractive index layer. Preferably the organic material of high refractive index layer comprises a free-radically polymerizable material having three or more (meth)acrylate groups, such as those previously described. Various suitable high refractive index compositions are known such as described in Pending U.S. application Ser. Nos. 11/026,573; 11/026,674; 11/026,702; all filed Dec. 30, 2004, and PCT Application Nos. US2005/045764; US2005/046526 and US2005/045876; incorporated herein by reference.

Various high refractive index particles are known including for example zirconia ("$ZrO_2$"), titania ("$TiO_2$"), antimony oxides, alumina, and tin oxides, alone or in combination. Zirconias for use in the high refractive index layer are available from Nalco Chemical Co. under the trade designation "Nalco OOSSOO8" and from Buhler AG Uzwil, Switzerland under the trade designation "Buhler zirconia Z-WO sol". Zirconia nanoparticle can also be prepared such as described in U.S. patent application Ser. No. 11/027,426 filed Dec. 30, 2004 and U.S. Pat. No. 6,376,590.

The concentration of (e.g. inorganic) particles in the low refractive index layer and/or the high refractive index layer is typically at least 5 vol-%, and preferably at least 15 vol-%.

The concentration of inorganic particle is typically no greater than about 50 vol-%, and more preferably no greater than 40 vol-%.

The inorganic nanoparticles are preferably treated with a surface treatment agent. Surface-treating the nano-sized particles can provide a stable dispersion in the polymeric resin. Preferably, the surface-treatment stabilizes the nanoparticles so that the particles will be well dispersed in the polymerizable resin and results in a substantially homogeneous composition. Furthermore, the nanoparticles can be modified over at least a portion of its surface with a surface treatment agent so that the stabilized particle can copolymerize or react with the polymerizable resin during curing. The incorporation of surface modified inorganic particles is amenable to covalent bonding of the particles to the free-radically polymerizable organic components, thereby providing a tougher and more homogeneous polymer/particle network.

In general, a surface treatment agent has a first end that will attach to the particle surface (covalently, ionically or through strong physisorption) and a second end that imparts compatibility of the particle with the resin and/or reacts with resin during curing. Examples of surface treatment agents include alcohols, amines, carboxylic acids, sulfonic acids, phosphonic acids, silanes and titanates. The preferred type of treatment agent is determined, in part, by the chemical nature of the metal oxide surface. Silanes are preferred for silica and other for siliceous fillers. Silanes and carboxylic acids are preferred for metal oxides such as zirconia. The surface modification can be done either subsequent to mixing with the monomers or after mixing. It is preferred in the case of silanes to react the silanes with the particle or nanoparticle surface before incorporation into the resin. The required amount of surface modifier is dependant upon several factors such particle size, particle type, modifier molecular wt, and modifier type. In general it is preferred that approximately a monolayer of modifier is attached to the surface of the particle. The attachment procedure or reaction conditions required also depend on the surface modifier used. For silanes it is preferred to surface treat at elevated temperatures under acidic or basic conditions for from 1-24 hr approximately. Surface treatment agents such as carboxylic acids may not require elevated temperatures or extended time.

Representative embodiments of surface treatment agents suitable for the compositions include compounds such as, for example, isooctyl trimethoxy-silane, N-(3-triethoxysilylpropyl)methoxyethoxyethyl carbamate, N-(3-triethoxysilylpropyl)methoxyethoxyethyl carbamate, 3-(methacryloyloxy)propyltrimethoxysilane, 3-acryloxypropyltrimethoxysilane, 3-(methacryloyloxy)propyltriethoxysilane, 3-(methacryloyloxy)propylmethyldimethoxysilane, 3-(acryloyloxypropyl)methyldimethoxysilane, 3-(methacryloyloxy)propyldimethylethoxysilane, 3-(methacryloyloxy)propyldimethylethoxysilane, vinyldimethylethoxysilane, phenyltrimethoxysilane, n-octyltrimethoxysilane, dodecyltrimethoxysilane, octadecyltrimethoxysilane, propyltrimethoxysilane, hexyltrimethoxysilane, vinylmethyldiacetoxysilane, vinylmethyldiethoxysilane, vinyltriacetoxysilane, vinyltriethoxysilane, vinyltriisopropoxysilane, vinyltrimethoxysilane, vinyltriphenoxysilane, vinyltri-t-butoxysilane, vinyltris-isobutoxysilane, vinyltriisopropenoxysilane, vinyltris(2-methoxyethoxy)silane, styrylethyltrimethoxysilane, mercaptopropyltrimethoxysilane, 3-glycidoxypropyltrimethoxysilane, acrylic acid, methacrylic acid, oleic acid, stearic acid, dodecanoic acid, 2-[2-(2-methoxyethoxy)ethoxy]acetic acid (MEEAA), beta-carboxyethylacrylate (BCEA), 2-(2-methoxyethoxy)acetic acid, methoxyphenyl acetic acid, and mixtures thereof.

The surface modification of the particles in the colloidal dispersion can be accomplished in a variety known ways, such as described in previously cited U.S. patent application Ser. No. 11/027,426 filed Dec. 30, 2004 and U.S. Pat. No. 6,376,590.

A combination of surface modifying agents can be useful, wherein at least one of the agents has a functional group co-polymerizable with a hardenable resin. Combinations of surface modifying agent can result in lower viscosity. For example, the polymerizing group can be ethylenically unsaturated or a cyclic function subject to ring opening polymerization. An ethylenically unsaturated polymerizing group can be, for example, an acrylate or methacrylate, or vinyl group. A cyclic functional group subject to ring opening polymerization generally contains a heteroatom such as oxygen, sulfur or nitrogen, and preferably a 3-membered ring containing oxygen such as an epoxide.

A preferred combination of surface modifying agent includes at least one surface modifying agent having a functional group that is copolymerizable with the organic component of the polymerizable resin and a second modifying agent different than the first modifying agent. The second modifying agent is preferably a polyalkyleneoxide containing modifying agent that is optionally co-polymerizable with the organic component of the polymerizable composition.

Surface modified colloidal nanoparticles can be substantially fully condensed. Non-silica containing fully condensed nanoparticles typically have a degree of crystallinity (measured as isolated metal oxide particles) greater than 55%, preferably greater than 60%, and more preferably greater than 70%. For example, the degree of crystallinity can range up to about 86% or greater. The degree of crystallinity can be determined by X-ray diffraction techniques. Condensed crystalline (e.g. zirconia) nanoparticles have a high refractive index whereas amorphous nanoparticles typically have a lower refractive index.

The inorganic particles preferably have a substantially monodisperse size distribution or a polymodal distribution obtained by blending two or more substantially monodisperse distributions. Alternatively, the inorganic particles can be introduced having a range of particle sizes obtained by grinding the particles to a desired size range. The inorganic oxide particles are typically non-aggregated (substantially discrete), as aggregation can result in optical scattering (haze) or precipitation of the inorganic oxide particles or gelation. The inorganic oxide particles are typically colloidal in size, having an average particle diameter of 5 nanometers to 100 nanometers. The particle size of the high index inorganic particles is preferably less than about 50 nm in order to have sufficiently transparent. The average particle size of the inorganic oxide particles can be measured using transmission electron microscopy to count the number of inorganic oxide particles of a given diameter.

The low refractive index layer or antireflective film can provide a gloss or matte surface. For example, the surface can be roughened or textured to provide a matte surface. This can be accomplished in a variety of ways as known in the art including embossing the low refractive index surface with a suitable tool that has been bead-blasted or otherwise roughened, as well as by curing the composition against a suitable roughened master as described in U.S. Pat. Nos. 5,175,030 (Lu et al.) and 5,183,597 (Lu).

Matte low and high refractive index coatings can also be prepared by adding a suitably sized particle filler such as silica sand or glass beads to the composition. Such matte particles are typically substantially larger than the surface modified low refractive index particles. For example the average particle size typically ranges from about 1 to 10 microns. The concentration of such matte particles may range from at least 2 wt-% to about 10 wt-% or greater. At concentrations of less than 2 wt-% (e.g. 1.8 wt-%, 1.6 wt-%, 1.4 wt-%, 1.2 wt-%, 1.0 wt-%, 0.8 wt-%, 0.6 wt-%, the concentration is typically insufficient to produce the desired reduction in gloss (i.e. haze).

In yet another aspect, matte antireflective films can be prepared by providing the high refractive index layer and low refractive index (e.g. surface) layer on a matte film substrate. Exemplary matte films are commercially available from U.S.A. Kimoto Tech, Cedartown, Ga. under the trade designation "N4D2A".

The (e.g. display) articles described herein, comprised of transparent substrates, typically have a transmission of at least 80%, at least 85% and preferably at least 90%. Further, the haze is typically less than 5%, preferably less than 2% and more preferably less than 1%. Matte antireflective films typically have lower transmission and higher haze values than typical gloss films. For examples the haze is generally at least 5%, 6%, 7%, 8%, 9%, or 10% as measured according to ASTM D1003. Whereas gloss surfaces typically have a haze of less than 5%, 4% or 3%. Further, gloss surfaces typically have a gloss of at least than 130 as measured according to ASTM D 2457-03 at 60°.

Referring now to FIG. 1, a perspective view of an article (here a computer monitor 10) having an optical display 12 coupled within a housing 14. The optical display 12 is a substantially transparent material through which a user can view text, graphics or other displayed information.

In the case of display panels, the display substrate 12 is light transmissive, meaning light can be transmitted through the display substrate 12 such that the display can be viewed. Both transparent (e.g. gloss) and matte light transmissive substrates 12 are employed in display panels. The display substrate 12 may comprise or consist of any of a wide variety of non-polymeric materials, such as glass, or various thermoplastic and crosslinked polymeric materials, such as polyethylene terephthalate (PET), (e.g. bisphenol A) polycarbonate, cellulose acetate, poly(methyl methacrylate), and polyolefins such as biaxially oriented polypropylene which are commonly used in various optical devices.

Figure 2:
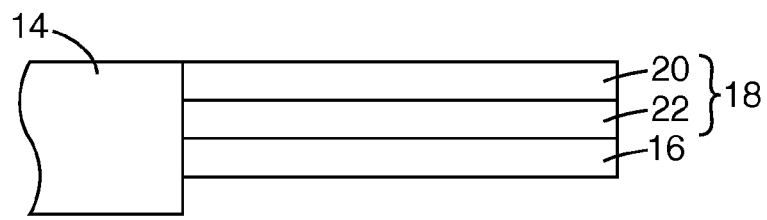
FIG. 2 is a sectional view of the article of FIG. 1 taken along line 2-2 illustrating an antireflection film having a low refractive index layer.

With reference to FIG. 2, the optical display 12 includes an antireflection film 18 having at least one layer of a high refractive index layer 22 and a low refractive index layer 20. The low refractive index layer 20 is provided between the high refractive index layer and the viewing surface. Low refractive index layer 20 is typically a surface layer exposed to the environment, as depicted in FIG. 2.

The high refractive index layer has a refractive index of at least 1.50, or 1.55, or 1.60 or greater. The maximum refractive index of the high index layer is typically no greater than about 1.75 for coatings having high refractive index inorganic particles dispersed in a crosslinked organic material. The low refractive index layer has a refractive index less than a high refractive index layer. The difference in refractive index between the high refractive index layer and low refractive index layer is typically at least 0.05, 0.10, or 0.15, or 0.20 or greater. The low refractive index layer typically has a refractive index of less than about 1.5, or less than about 1.47, or less than about 1.45, or less than about 1.42. The minimum refractive index of the low index layer is generally at least about 1.35.

Antireflective films preferably have an average reflectance of less than 8%, 7%, or 6.5% at 450 nm to 650 nm as measured with a spectrophotometer as described in the examples.

Figure 3:
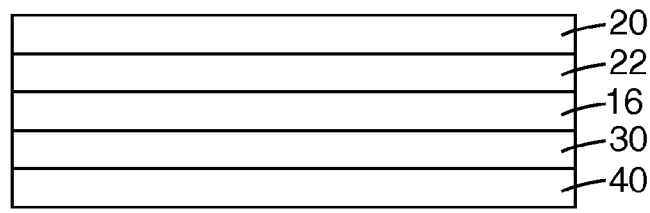
FIG. 3 is an embodied antireflective film article.

With reference to FIG. 3, an embodied antireflective film article typically comprises a light transmissive substrate 16. The high refractive index layer 22 is disposed between the film substrate 16 and low refractive index layer 20.

As an alternative to an antireflective film, low refractive index layer 20 may be employed alone as a protective surface layer. In such embodiment, low index layer 20 may be coupled directly to optical substrate 12 or film substrate 16 without a high refractive index layer.

In one aspect, the antireflective film comprises a relatively thick high refractive index layer in combination with a relatively thin low refractive index layer. The high refractive index layer typically has a thickness of at least 0.5 microns, preferably at least 1 micron, more preferably at least 2 micron and typically no greater than 10 microns. The low refractive index layer has an optical thickness of about ¼ wave (as described in U.S. Pat. No. 3,833,368). Such thickness is typically less than 0.5 microns, more typically less than about 0.2 microns and often about 90 nm to 110 nm.

This embodiment can provide a durable antireflective film while being free of additional hardcoat layers.

In yet another embodiments, both the low refractive index layer and high refractive index layer may be relatively thin, each layer being at least about 50 nm and less than 0.5 microns (e.g. less than 0.2 microns). For this embodiment as well as for embodiments wherein the low refractive index layer and/or high refractive index layer may lack the inclusion of surface modified inorganic particles, the antireflective film article preferably comprises a hardcoat layer. The hardcoat layer preferably contains (e.g. surface modified) nanometer-sized inorganic oxide particles dispersed in a binder matrix. Typically the hardcoat is formed by coating a curable liquid ceramer composition onto the substrate and curing the composition in situ to form a hardened film. Suitable coating methods include those previously described for application of the fluorochemical surface layer. Further details concerning hardcoats can be found in U.S. Pat. Nos. 6,132,861 (Kang et al. '861), 6,238,798 B1 (Kang et al. '798), 6,245,833 B1 (Kang et al. '833) and 6,299,799 (Craig et al. '799); incorporated herein by reference.

The hardcoat layer is typically provided between the substrate and the high refractive index layer or between the substrate and low refractive index layer for embodiments wherein the low refractive index layer is employed independently. When present, the thickness of the hardcoat layer is typically at least 0.5 microns, preferably at least 1 micron, and more preferably at least 2 microns. The thickness of the hardcoat layer is generally no greater than 25 microns. Preferably the thickness ranges from 3 microns to 5 microns.

The antireflective film may comprise other layers. Various permanent and removable adhesive compositions 30 may be provided on the opposite side of the film substrate 16. For embodiments that employ pressure sensitive adhesive, the antireflective film article typically include a removable release liner 40. During application to a display surface, the release liner is removed so the antireflective film article can be adhered to the display surface.

Suitable adhesive compositions include (e.g. hydrogenated) block copolymers such as those commercially available from Kraton Polymers, Westhollow, Tex. under the trade designation "Kraton G-1657", as well as other (e.g. similar) thermoplastic rubbers. Other exemplary adhesives include acrylic-based, urethane-based, silicone-based and epoxy-based adhesives. Preferred adhesives are of sufficient optical quality and light stability such that the adhesive does not yellow with time or upon weather exposure so as to degrade the viewing quality of the optical display. The adhesive can be applied using a variety of known coating techniques such as transfer coating, knife coating, spin coating, die coating and the like. Exemplary adhesives are described in U.S. Patent Application Publication No. 2003/0012936. Several of such adhesives are commercially available from 3M Company, St. Paul, Minn. under the trade designations 8141, 8142, and 8161.

The antireflective film substrate 16 is selected based in part on the desired optical and mechanical properties such as flexibility, dimensional stability and impact resistance. Substrate 16 may comprise any of the same thermoplastic and crosslinked polymeric materials as optical display 12. Substrate 16 may also comprise or consist of polyamides, polyimides, phenolic resins, polystyrene, styrene-acrylonitrile copolymers, epoxies, and the like. In addition, the substrate 16 may comprise a hybrid material, having both organic and inorganic components. The film substrate 16 thickness typically also will depend on the intended use. For most applications, substrate thicknesses of less than about 0.5 mm are preferred, and more preferably about 0.02 to about 0.2 mm. Self-supporting polymeric films are preferred. The polymeric material can be formed into a film using conventional film-making techniques such as by extrusion and optional uniaxial or biaxial orientation of the extruded film. The substrate can be treated to improve adhesion between the substrate and the adjacent layer, e.g., chemical treatment, corona treatment such as air or nitrogen corona, plasma, flame, or actinic radiation. If desired, an optional tie layer or primer can be applied to the substrate and/or hardcoat layer to increase the interlayer adhesion.

Various light transmissive optical films suitable for use as the film substrate are known including but not limited to, multilayer optical films, microstructured films such as retroreflective sheeting and brightness enhancing films, (e.g. reflective or absorbing) polarizing films, diffusive films, as well as (e.g. biaxial) retarder films and compensator films such as described in U.S. Patent Application Publication No. 2004/0184150, Jan. 29, 2004.

As described in U.S. Patent Application 2003/0217806 multilayer optical films provide desirable transmission and/or reflection properties at least partially by an arrangement of microlayers of differing refractive index. The microlayers have different refractive index characteristics so that some light is reflected at interfaces between adjacent microlayers. The microlayers are sufficiently thin so that light reflected at a plurality of the interfaces undergoes constructive or destructive interference in order to give the film body the desired reflective or transmissive properties. For optical films designed to reflect light at ultraviolet, visible, or near-infrared wavelengths, each microlayer generally has an optical thickness (i.e., a physical thickness multiplied by refractive index) of less than about 1 µm. However, thicker layers can also be included, such as skin layers at the outer surfaces of the film, or protective boundary layers disposed within the film that separate packets of microlayers. Multilayer optical film bodies can also comprise one or more thick adhesive layers to bond two or more sheets of multilayer optical film in a laminate.

Further details of suitable multilayer optical films and related constructions can be found in U.S. Pat. No. 5,882,774 (Jonza et al.), and PCT Publications WO 95/17303 (Ouderkirk et al.) and WO 99/39224 (Ouderkirk et al.). Polymeric multilayer optical films and film bodies can comprise additional layers and coatings selected for their optical, mechanical, and/or chemical properties. See U.S. Pat. No. 6,368,699 (Gilbert et al.). The polymeric films and film bodies can also comprise inorganic layers, such as metal or metal oxide coatings or layers.

In order to reduce or eliminate optical fringing within the high refractive index layer it is preferred that the antireflective film substrate has a refractive index close to that of the high refractive index layer, i.e. differs from the high refractive index layer by less than 0.05, and more preferably less than 0.02. Alternatively, optical fringing can be eliminated or reduced by providing a high index primer on the film substrate, the primer being chosen to closely match the refractive index of the high refractive index layer.

In one embodiment, a high refractive index primer coating is applied to either the display substrate surface or film substrate at a thickness for example ranging from about 20 nm to 80 nm. A hardcoat layer or more preferably a durable high refractive index layer is then applied to the primed surface of the substrate. When coated on a film substrate such as PET, it yields a high-refractive index coating (e.g. RI~1.67) that closely matches the refractive index of the high-index hardcoat applied as the next layer. This helps to reduce interference fringing such as that due to index mismatches with a conventional acrylate primer.

Suitable high refractive index primers can be prepared from compositions having a (e.g. high concentration) of high refractive index inorganic nanoparticles. For example, one suitable primer composition may comprise about 80 wt-% surface modified high refractive index particles in combination with about 20 wt-% of an (e.g. acrylic) polymeric binder. Another preferred primer coating material for use in these constructions is available from Sumitomo Osaka Cement Under the trade designation "Sumicefine TM-AS-1". This material is an aqueous dispersion containing conductive antimony tin oxide nanoparticles and a polyester binder. This coating also helps to improve adhesion of the high-index hardcoat to the PET substrate film, relative to uncoated PET film. Finally, the antimony tin oxide nanoparticles provide good antistatic performance (static charge decay times 0.01-0.02 sec) after application of the high-index hardcoat.

In yet other embodiments, optical fringing can be eliminated or reduced by roughening the substrate to which a hardcoat or durable high refractive index layer is applied. The substrate surface may be roughened for example with 9 micron to 30 micron microabrasives.

The low refractive index coating and antireflective film described herein are suitable for application to optical displays ("displays"). The displays include various illuminated and non-illuminated displays panels. Such displays include multi-character and especially multi-line multi-character displays such as liquid crystal displays ("LCDs"), plasma displays, front and rear projection displays, cathode ray tubes ("CRTs"), signage, as well as single-character or binary displays such as light emitting tubes ("LEDs"), signal lamps and switches.

The low refractive index coating and antireflective film can be employed with a variety of portable and non-portable information display articles. These articles include, but are not limited to, PDAs, LCD-TV's (both edge-lit and direct-lit), cell phones (including combination PDA/cell phones), touch sensitive screens, wrist watches, car navigation systems, global positioning systems, depth finders, calculators, electronic books, CD and DVD players, projection televisions screens, computer monitors, notebook computer displays, instrument gauges, and instrument panel covers. These devices can have planar or curved viewing faces.

The antireflective material, can be employed on a variety of other articles as well such as for example camera lenses, eyeglass lenses, binocular lenses, mirrors, retroreflective sheeting, automobile windows, building windows, train windows, boat windows, aircraft windows, vehicle headlamps and taillights, display cases, eyeglasses, overhead projectors, stereo cabinet doors, stereo covers, watch covers, as well as optical and magneto-optical recording disks, and the like.

The low refractive index coating may also be applied to a variety of other articles including (e.g. retroreflective) signage and commercial graphic display films employed for various advertising, promotional, and corporate identity uses.

The (e.g. MEK) repellent low refractive index coatings also find utility for photolithography.

While the invention has been described in terms of preferred embodiments, it will be understood, of course, that the invention is not limited thereto since modifications may be made by those skilled in the art, particularly in light of the foregoing teachings.

EXAMPLES

Ingredients Employed in the Examples

"HFPO-" as used in the examples, "HFPO-" refers to the end group $F(CF(CF_3)CF_2O)_aCF(CF_3)$— of the methyl ester $F(CF(CF_3)CF_2O)_aCF(CF_3)C(O)OCH_3$, wherein a averages about 6 to 7, with an average molecular weight of about 1200 g/mol to 1400 g/mol. It can be prepared according to the method reported in U.S. Pat. No. 3,250,808 (Moore et al.), the disclosure of which is incorporated herein by reference, with purification by fractional distillation.

SR351 is the trade designation for trimethylolpropane triacrylate (TMPTA), and was obtained from Sartomer Company, of Exton, Pa.

SR399 is the trade designation for dipentaerythritol pentaacrylate (molecular weight of 525 g/mole), a non-fluorinated multifunctional (meth)acrylate monomer obtained from Sartomer Company, of Exton, Pa.

Free-Radically Polymerizable Materials having High Fluorine Content

1. CN 4000 was obtained from Sartomer Company, Exton, Pa.

2. 7F-A is 2,2,3,3,4,4,4-heptafluorobutyl acrylate obtained from Lancaster Chemicals, of Windham, N.H. and was used without further purification.

3. PFCH-A is perfluorocyclohexyl acrylate prepared as described in U.S. Pat. No. 5,148,511 (Savu and McAllister), Example 1, except that acrylol chloride was used in place of methacrylol chloride.

4. Br-FKM (E18402) is a free-radically polymerizable amorphous terpolymer of tetrafluoroethylene (TFE), vinylidene fluoride (VDF) and hexafluoropropylene (HFP), and a Br- and I-containing cure site monomer having 70 wt. % fluorine, and available from Dyneon LLC of Oakdale, Minn.

5. Br-FKM (E15742) is a free-radically polymerizable amorphous terpolymer of tetrafluoroethylene (TFE), vinylidene fluoride (VDF) and hexafluoropropylene (HFP), and a Br-containing cure site monomer having 70 wt. % fluorine, and available from Dyneon LLC of Oakdale, Minn.

Silquest A1106 is believed to be an oligomerized product of gamma-aminopropyl trimethoxysilane, available from GE Silicones of Parkersburg, W.Va. It was used as a 25% solids solution in methanol.

ESACURE KB-1 is a benzil dimethyl ketal photoinitiator obtained from Sartomer and was used as received.

HFPO-urethanes were prepared as described by Klun et al. in U.S. patent application Ser. No. 11/277,162. The HFPO abbreviation is used as a general acronym for the perfluoropolyether oligomer of hexafluoropropylene oxide. HFPO-U-1 to HFPO-U-5 are fluoropolyether urethane materials of previously described Formula 3.

1. HFPO-U-1 contains 15.6 wt-% F, and was prepared as described in Preparation 6 of U.S. patent application Ser. No. 11/277,162 (Klun et al.).

2. HFPO-U-2 contains 58.3 wt-% F, and was prepared as described in Preparation 24 of U.S. patent application Ser. No. 11/277,162 (Klun et al.).

3. HFPO-U-3 contains 6 wt-% F, and was prepared as described in Preparation 5.1 of U.S. patent application Ser. No. 11/277,162 (Klun et al.).

4. HFPO-U-4 contains 25.8 wt-% F, and was prepared as described in Preparation 5.3 of U.S. patent application Ser. No. 11/277,162 (Klun et al.).

5. HFPO-U-5 contains 39.4 wt-% F, and was prepared as described in Preparation 5.5 of U.S. patent application Ser. No. 11/277,162 (Klun et al.).

6. HFPO-U-6 (Des N100/0.85 PET3A/0.15 HFPO) contains about 39 wt-% F and was prepared as described in Preparation 5.18 of U.S. patent application Ser. No. 11/277,162 (Klun et al.).

HFPO-AEA and HFPO-EO4-A were prepared as described in Preparations 31A and 31C of U.S. patent application Ser. No. 11/277,162 (Klun et al.).

$HFPO—C(O)N(H)CH_2CH(OC(O)CH=CH_2)CH_2OC(O)CH=CH_2$ (FC-4), was prepared as described in 59795US007 (Klun et al.).

20 nm silica nanoparticles were prepared according to the method described in U.S. Pat. application Ser. No. 11/026,640 (Jing, et al.), Preparation #4.

$ZrO_2$ sols (40.8% solids in water) was prepared were prepared in accordance with the procedures described in U.S. patent application Ser. No. 11/079,832 filed Mar. 14, 2005 that claims priority to U.S. patent application Ser. No. 11/078, 468 filed Mar. 11, 2005. The resulting $ZrO_2$ sols were evaluated with Photo Correlation Spectroscopy (PCS), X-Ray Diffraction and Thermal Gravimetric Analysis as described in U.S. patent application Ser. Nos. 11/079,832 and 11/078468. The $ZrO_2$ sols used in the examples had properties in the ranges that follow:

| Dispersion Index | PCS Data | | |
|---|---|---|---|
| | Intensity avg size (nm) | Volume- avg size (nm) | (Intensity-avg)/ (Volume-avg) |
| 1.0-2.4 | 23.0-37.0 | 8.0-18.8 | 1.84-2.97 |

| Relative Intensities | | Apparent Crystallite Size (nm) | | | | Weighted |
|---|---|---|---|---|---|---|---|
| Cubic/ Tetragonal | Monoclinic | (C, T) (1 1 1) | M (−1 1 1) | M (1 1 1) | Avg M Size | % C/T | Avg XRD Size |
| 100 | 6-12 | 7.0-8.5 | 3.0-6.0 | 4.0-11.0 | 4.5-8.3 | 89%-94% | 7.0-8.4 |

Surface Modified Zirconia Nanoparticles 20.4 lbs of an aqueous dispersion of 10 nm zirconia nanoparticles (40.8% solids in water) was added to a 10 gallon reactor. 12.9 lbs additional water and 33.3 lbs 1-methoxy-2-propanol were added to the reactor with stirring. 2.5 lbs of 3-methacryloxypropyltrimethoxysilane was added slowly to the reactor with stirring. 0.021 lbs of a 5% solution in water of Prostab 5198 was added to the reactor with stirring. The mixture was stirred 18 hours at 80° C.

The reaction mixture was heated under vacuum (24-40 torr) and the 1-methoxy-2-propanol/water azeotrope was distilled off to remove substantially all of the water, while slowly adding 70.5 lbs of additional 1-methoxy-2-propanol. 0.4 lbs of 30% ammonium hydroxide was added to the reaction mixture, then the reaction was concentrated to 59.2% solids by distilling off 1-methoxy-2-propanol. The surface modification reaction resulted in a mixture containing 59.2% surface modified zirconia ($ZrO_2$—SM), by weight, in 1-methoxy-2-propanol. The final mixture was filtered through a 0.5 micron filter.

Substrates of the Examples

Films were coated on one of two substrates. Substrate S1, a PET with a hardcoat, was prepared as described in U.S. patent application Ser. No. 11/277,162 (Klun et al.).

Substrate S2, included a high refractive index layer on a 5 mil primed PET substrate obtained from Dupont under the trade designation "Melinex 618"). A high refractive index hardcoat formulation was prepared, as follows: 246.6 grams 2-butanone (EMD Chemicals), 94.1 grams SR399, and 16.1 grams Irgacure 184 were added to a 2-L amber jar. The mixture was shaken until homogenous. 735.1 grams of $ZrO_2$—SM (59.2% solids in 2-methoxy-1-propanol) was added slowly to the mixture and gently mixed until homogenous. This results in a composition containing 50 wt-% solids.

This formulation (preferably filtered through a 1 micron filter followed by a 0.2 micron filter) was coated onto the unprimed surface of a 5 mil PET film (obtained from Dupont) at 30 fpm. The solution was syringe-pumped into a 4 inch wide coating die at 12.45 cc/min. The coating was dried by passing through a 10 foot an oven set at 120° C. The coating was then partially cured with a Light Hammer 6 UV source (Fusion UV Systems, Inc., Gaithersburg, Md.), at 25% power, under nitrogen. The resulting partially cured high refractive index layer was approximately 4 microns thick.

Low Refractive Index Formulations were prepared from 10% solids masterbatch solutions of each desired reagent. These were mixed to obtain the weight ratios listed in the tables below. The reagents were mixed in amber bottles to enhance the storage stability of the formulations. The low index reagent was added first followed by further dilution to ~5% solids with MEK. The remaining reagents were then added to this component. Finally, the solution was diluted with MEK to obtain the desired percents solids. Once a solution was prepared it was coated within 48 hours.

100 nm optical thickness antireflective coatings were prepared by use of a #4 or #5 Meyer rod and were coated from 3% solids solutions in methyl ethyl ketone (MEK) on Substrate S2. Separately, thicker coatings (~1-3 um) used for refractive index measurements, were coated on substrate S1 from a 10% solids solution in MEK by use of a #12 Meyer Rod. The coatings were allowed to dry in ambient conditions for between 5 and 10 min and were cured using a bench top Fusion System UV processor (Fusion UV Systems, Inc., Gaithersburg, Md.) with a 500 Watt H-bulb. The films were cured by exposure to these UV conditions at a line speed of 10 fpm. Two passes were used to ensure the coatings were fully cured.

Refractive Index Measurements:

Refractive index measurements were made with a Metricon Refractometer (Metricon Corp., Pennington, N.J.) using a Zr crystal and Ne laser at 660 nm to determine the angle for the loss of total internal reflection (TIR) and hence the refractive index of the coating. The coating thickness needed to be at least 1-3 um thick to ensure a reproducible measurement. Typically such thickness are obtained by use of a #12 Meyer Rod and a 10% solids solution of the desired formulation applied to substrate S1 and cured same as previously described.

Optical Measurements:

Haze and transmission measurements were collected by means of a BYK-Gardner haze meter (BYK-Gardner USA, Columbia, Md.). The reported values are an average of at least four measurements.

Surface reflection values were determined by the use of a Perkin-Elmer Lambda 900 UV/Vis spectrophotometer (Perkin-Elmer, Inc., Wellesley, Mass.). Films were wiped cleaned with a fiber-free soft cloth using isopropyl alcohol (IPA) and allowed to dry. The reflection data were collected between 800 and 350 nm at a sampling resolution of 5 nm/data point. The data reported in the tables below represent the numeric average reflection, % $R_{avg}$, calculated from the reflection data obtained between 450 nm to 650 nm.

Contact Angle Measurements:

The coatings were rinsed for 1 minute by hand agitation in IPA before being subjected to water contact angle measurements. Measurements were made using deionized water or hexadecane filtered through a filtration system obtained from Millipore Corporation (Billerica, Mass.), on a video contact angle analyzer available as product number VCA-2500XE from AST Products (Billerica, Mass.). Reported values are the averages of measurements on at least three drops measured on both the right and the left sides of the drops. Drop sizes of about 5 μL were used for static water contact angle measurements.

Sand Durability:

Durability of the antireflective (AR) coatings was evaluated by using a modified Oscillating Sand Method similar to ASTM F 735-94. An orbital shaker, VWR DS-500E (VWR, Bristol, Connecticut) was used to conduct this test. A disk of diameter 89 mm was cut from the sample to fit snugly in the lid of a 16 ounce plastic jar (jar W216922 from Wheaton, Millville, N.J.). In the middle of the disk, an optical zone of approximately 25 mm diameter was marked on the uncoated side of the film with a permanent ink marker. An initial reflection spectrum was obtained as described above and the numeric average of the reflection value between 450 and 650 nm was determined. The coated side of the film was placed upwards in the jar lid and the jar was filled with 50 grams of pre-treated 20-30 mesh Ottawa sand (VWR, Bristol, Connecticut). The sand was pre-treated by oscillating 200 g of sand per jar for 2 hrs at 400 rpm. The jar was capped and placed in the shaker set at 300 rpm for 15 minutes. After this time, the films were removed from the jar lids and rinsed with IPA. Another reflection measurement was made as before in the marked optical zone of the film. The "before" and "after" average reflection values were compared. A more durable film has a smaller difference between the % Ravg (before) and % Ravg (after) values.

Ink Repellency Loss (% IR-Loss)

In addition to the retention of the % R after testing, it is possible to further assess durability of the low index layer by the determination of the percent ink repellency loss (% IR-Loss) of the top coating. The % IR loss is determined as described in FN 60316US007 (U.S. patent application Ser. No. 11/277,162) "Durability of Ink Repellency" by marking the coated surface of the tested film with a Sharpie™ permanent marker through the diameter of the test film and determining the ratio of the length of the un-beaded ink mark to the diameter of the test film (89 mm).

Steel Wool Durability Test The abrasion resistance of the cured films 4-1 through 4-4 were tested cross-web to the coating direction by use of a mechanical device capable of oscillating a steel wool sheet adhered to a stylus across the film's surface. The stylus oscillated over a 60 mm wide sweep width at a rate of 210 mm/sec (3.5 wipes/sec) wherein a "wipe" is defined as a single travel of 60 mm. The stylus had a flat, cylindrical base geometry with a diameter of 3.2 cm. The stylus was designed to enable attachment of additional weights to increase the force exerted by the steel wool normal to the film's surface. The #0000 steel wool sheets were "Magic Sand-Sanding Sheets" available from Hut Products, Fulton, Mo. The #0000 has a specified grit equivalency of 600-1200 grit sandpaper. The 3.2 cm steel wool discs were die cut from the sanding sheets and adhered to the 3.2 cm stylus base with 3M Brand Scotch Permanent Adhesive Transfer tape.

MEK Repellency Test:

A drop of MEK is placed on the cured coating. If the MEK remains as a beaded droplet on the surface, it considered to be repellent. If the MEK dissolves the coating, swelling or causing whiteness in the coating, the coating is considered not to be repellent.

Figure 4:
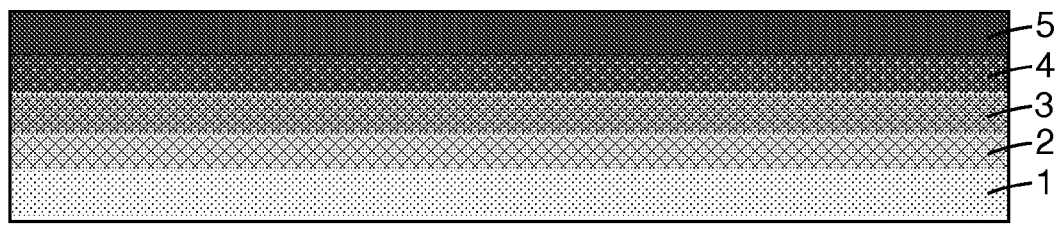

Marker Test:

The marker tip of a Sanford King Size™ Permanent Marker, available from Sanford, Oak Brook, Ill., was cut with a razor blade at an angle to allow it to provide a wide marking width. On the sample a wide straight line was drawn with the help of a ruler in a speed roughly 6 inches per second. The test sample was placed next to the 1~5 rating standard of FIG. 4, and a number rating was assigned.

Examples 1-1 through 1-21

Preparation of 100nm antireflection (AR) coatings based on the low index formulations shown in Table 1 were prepared as described earlier. All samples contained 1.5% ESACURE KB-1 as photoinitiator based on solids. The solutions were prepared at 3% solids in MEK, coated on substrate S2 using a #4 Meyer Rod, and cured as described previously. This coating technique provides a nominal optical coating thickness of about 100 nm. If necessary, the coating thickness can be modified by changing either the percent solids of the coating solution, the Meyer Rod number, or both, as is well known.

TABLE 2

Low Refractive Index Formulations

| Example | RF Acrylate Used (wt-% F) | Wt % RF Acrylate | Wt % HFPO-U-1 | Wt % 20 nm Silica particles | Wt % SR 399 | Wt-% F in Coating |
|---|---|---|---|---|---|---|
| 1-1 | CN 4000 | 40 | 20 | 20 | 20 | 25.1 |
| 1-2 | CN 4000 | 60 | 20 | 10 | 10 | 36.1 |
| 1-3 | CN 4000 (55%) | 50 | 0 | 25 | 25 | 27.5 |
| 1-4 | HFPO-AEA | 40 | 20 | 20 | 20 | 27.8 |
| 1-5 | HFPO-AEA | 60 | 20 | 10 | 10 | 40.1 |
| 1-6 | HFPO-AEA (61.7%) | 50 | 0 | 25 | 25 | 30.9 |
| 1-7 | HFPO-EO-4 | 40 | 20 | 20 | 20 | 26.0 |
| 1-8 | HFPO-EO-4 | 60 | 20 | 10 | 10 | 37.5 |
| 1-9 | HFPO-EO-4 (57.3%) | 50 | 0 | 25 | 25 | 28.9 |
| 1-10 | HFPO-U-2 | 32 | 36 | 16 | 16 | 24.3 |
| 1-11 | HFPO-U-2 | 47 | 36 | 8 | 8 | 33.0 |
| 1-12 | HFPO-U-2 (58.3%) | 50 | 0 | 25 | 25 | 29.2 |
| 1-13 | 7F-A | 40 | 20 | 20 | 20 | 24.1 |
| 1-14 | 7F-A | 60 | 20 | 10 | 10 | 34.6 |
| 1-15 | 7F-A (52%) | 50 | 0 | 25 | 25 | 26.2 |
| 1-16 | PFCH-A | 40 | 20 | 20 | 20 | 26.0 |
| 1-17 | PFCH-A | 60 | 20 | 10 | 10 | 37.4 |
| 1-18 | PFCH-A (57%) | 50 | 0 | 25 | 25 | 28.6 |
| 1-19 | HFPO-U-5 | 40 | 20 | 20 | 20 | 18.9 |
| 1-20 | HFPO-U-5 | 60 | 20 | 10 | 10 | 26.8 |
| 1-21 | HFPO-U-5 (39.4%) | 50 | 0 | 25 | 25 | 19.7 |

The coating quality was determined visually. The surface contact angle, refractive index, and reflectance (% $R_{avg}$) of the antireflective films was measured as previously described and is reported in Table 3 as follows.

TABLE 3

Antireflection Coatings on Substrate S2

| Low Refractive Index Coating Formulation of Table 2 | Fluorinated Material | Coating Quality | % Haze | Water Static Contact Angle | Refractive Index | % $R_{avg}$ (450-650 nm) |
|---|---|---|---|---|---|---|
| Uncoated Substrate S2 | none | Not applicable | 0.6 | 57.5 | 1.66 | 9.4 |
| 1-1 | CN 4000 | Good | 0.8 | 107.6 | 1.41 | 6.7 |
| 1-2 | CN 4000 | Good | 0.8 | 107.8 | 1.43 | 6.1 |
| 1-3 | CN 4000 | Poor | 0.7 | 104.5 | Not Detected | 7.2 |
| 1-4 | HFPO-AEA | Good | 1.5 | 111.0 | 1.44 | 5.7 |
| 1-5 | HFPO-AEA | Good | 4.3 | 110.7 | 1.43 | 6.3 |
| 1-6 | HFPO-AEA | Poor | 1.2 | 114.6 | Not Detected | 6 |
| 1-7 | HFPO-EO-4 | Good | 1.1 | 110.5 | 1.43 | 6.5 |
| 1-8 | HFPO-EO-4 | Good | 1.0 | 110.0 | 1.41 | 5.5 |
| 1-9 | HFPO-EO-4 | Poor | 1.8 | 111.8 | Not Detected | 8.4 |
| 1-10 | HFPO-U-2 | Good | 1.0 | 110 |  | 7.1 |
| 1-11 | HFPO-U-2 | Good | 1.2 | 111 | 1.438 | 8.1 |
| 1-12 | HFPO-U-2 | Poor-dewets | 6.3 | 115 |  | 6.5 |
| 1-13 | 7F-A | Good | 0.8 | 109 |  | 6.9 |
| 1-14 | 7F-A | Good | 0.6 | 108 | 1.483 | 6.2 |
| 1-15 | 7F-A | Poor-dewets | 0.7 | Not done |  | 9.2 |
| 1-16 | PFCH-A | Good | 0.7 | 109 |  | 7.1 |
| 1-17 | PFCH-A | Good | 0.5 | 108 | 1.49 | 5.8 |
| 1-18 | PFCH-A | Poor-dewets | 0.8 | Not done |  | 9.4 |
| 1-19 | HFPO-U-5 | Good | 0.9 | 110 |  | 7.4 |
| 1-20 | HFPO-U-5 | Good | 0.8 | 109 | 1.466 | 7.8 |
| 1-21 | HFPO-U-5 | Fair-Hazy | 1.4 | 110 |  | 7.9 |

Coating quality of the formulations lacking a fluoropolyether urethane compatabilizer (i.e. 1-3, 1-6, 1-9, 1-12, 1-15, and 1-18) were poor, and meaningful refractive index and reflectance could not be determined. Coatings of the low index formulations containing a fluoropolyether urethane compatibilizer (i.e. HFPO-U-1) were of good quality, exhibiting few or no defects such as "fish-eyes", dewets or high haze levels. Samples 1-12, 1-15, and 1-18 were so badly dewetted that the RI measurements were essentially similar to S2.

Examples 2-1 through 2-9

In Examples 2-1 through 2-9, respectively, the coated films of Examples 1-1, 1-2, 1-4, 1-5, 1-7, 1-8, 1-13, 1-14, 1-15 were subjected to the oscillating sand test to evaluate the durability of the coatings. The uncoated substrate, S2, had a % R avg (450-650) value of 9.4. Ink Repellency Loss was also measured. Results are shown in Table 4.

TABLE 4

Sand Durability Test Results of Antireflection Coatings on Substrate S2

| | Example | | | | | | | | |
|---|---|---|---|---|---|---|---|---|---|
| | 2-1 | 2-2 | 2-3 | 2-4 | 2-5 | 2-6 | 2-7 | 2-8 | 2-9 |
| Low Refractive Index Formulation of Table 2 | 1-1 | 1-2 | 1-4 | 1-5 | 1-7 | 1-8 | 1-13 | 1-14 | 1-15 |
| % $R_{(avg)}$ "before" | 8.3 | 6.1 | 5.7 | 6.3 | 6.5 | 5.5 | 6.9 | 6.2 | 9.2 |
| % $R_{(avg)}$ "after" | 8.3 | 7.8 | 6.2 | 8.3 | 9.1 | 9.2 | 7.8 | 6.9 | 9.0 |
| % Ink Repellency Loss | 0 | 34 | 90 | 51 | 100 | 100 | 0 | 100 | 100 |

Examples 2-1, 2-2, 2-3, 2-4 and 2-7 were all fairly durable in the Sand Test, considering both the change in % $R_{(avg)}$ and the % Ink Repellency Loss. Examples 2-1, 2-2 and 2-7 were particularly durable.

Examples 3-1 through 3-7

In Examples 3-1 through 3-7, the effect of changing the type of the HFPO-U used in the coating formulation was explored. Examples 3-1 and 3-2 are controls having no HFPO-U. Examples 3-3 through 3-7 employ HFPO-U-1, -2, -3, -4, and -5, respectively. The two controls were formulated such that Example 3-1 allows comparison based on the premise that the HFPO-U in Examples 3-3 through 3-7 had been substituted for some of the SR-351 in the control, and Example 3-2 allows comparison based on the premise that the HFPO-U in Examples 3-3 through 3-7 had been substituted for some of the CN 4000 in the control. The controls 3-1 and 3-2 also serve to roughly bracket the overall level of wt-% F in Examples 3-3 through 3-7. Compatibility and Coating Quality were assessed, and Haze was measured. The use of HFPO-U-1, -3, -4, and -5 resulted in much improved coatings. Results are shown in Table 5.

TABLE 5

Impact of HFPO-U on Compatibility and Coating Quality of CN4000/SR-351 Low Index Systems:

| Example | Wt-% SR351 | Wt-% CN 4000 | Wt-% HFPO-U (HFPO-U type) | Wt-% F in HFPO-U | Compatibility at 100% solids (*) | Wt % F in Coating | Coating Quality (**) (~1 um) | Haze of ~1 um Coating |
|---|---|---|---|---|---|---|---|---|
| 3-1 | 85 | 15 | 0 | 0 | I | 8.3 | poor | 5.1 |
| 3-2 | 70 | 30 | 0 | 0 | I | 16.5 | poor | 14.0 |
| 3-3 | 70 | 15 | 15 (HFPO-U-1) | 15.6 | C | 10.6 | good | 0.7 |
| 3-4 | 70 | 15 | 15 (HFPO-U-2) | 58.3 | I | 17.0 | poor | 24 |
| 3-5 | 70 | 15 | 15 (HFPO-U-3) | 6.0 | Sl. H | 9.2 | good | 2.6 |
| 3-6 | 70 | 15 | 15 (HFPO-U-4) | 25.8 | C | 12.1 | good | 0.5 |
| 3-7 | 70 | 15 | 15 (HFPO-U-5) | 39.5 | Sl. H | 14.2 | good | 3.9 |

(*) C = Compatible, Clear mixture, no detectable phase separation, I = incompatible, hazy and phase separated mixture, H = Hazy mixture, Sl. H = slightly hazy mixture
(**) Coated on substrate S1, using 10% solids solution and #12 Meyer Rod.

Examples 4-1 to 4-4 illustrate low refractive index composition based on mixtures of reactive fluoropolymers with HFPO-urethanes.

TABLE 6

Low Refractive Index Compositions Comprising Polymerizable Fluoropolymers

| Formulation (wt-% F) | Br-FKM (E 18402) | 20 nm Si-particles | SR 399 | HFPO-AEA | HFPO-U-1 | A1106 | KB-1 |
|---|---|---|---|---|---|---|---|
| 4-1 (24.5%) | 35 | 40 | 20 | 0 | 0 | 5 | 1.5 |
| 4-2 (24.5%) | 32 | 36 | 18 | 2.2 | 6.8 | 5 | 1.5 |
| 4-3 (38%) | 55 | 10 | 30 | 0 | 0 | 5 | 1.5 |
| 4-4 (37%) | 50 | 9.1 | 27 | 2.2 | 6.8 | 5 | 1.5 |

| Formulation | % T | % Haze | Initial Contact Angle | % R Avg-Before Sand Testing* | % R Avg-After Sand Testing* | Damage by SW after 20 wipes 500 g | Contact angle after SW testing |
|---|---|---|---|---|---|---|---|
| 4-1 | 96 | 0.5 | 97 | 5.8 | 6.2 | none | 96 |
| 4-2 | 95 | 2 | 114 | 6.1 | 6.1 | none | 110 |
| 4-3 | 96 | 0.9 | 92 | 5.0 | 7.1 | none | 93 |
| 4-4 | 94 | 4.4 | 111 | 7.4 | 7.5 | none | 114 |

The following examples show that reactive (bromine and iodine containing) and non-reactive, solvent soluble fluoropolymers can be combined with the perfluoropolyether urethane multiacrylates, and optionally other hydrocarbon acrylates to give clear, solvent and marker resistant coatings with high advancing and receding contact angles.

General Coating and Curing Procedure

All coating solutions were prepared at 5 weight percent solids in MEK, except PVDF containing solutions, which were prepared at 5 weight percent in N-methylpyrrolidinone. Photoinitiator KB-1 was added at 1% solids with respect to the other solids present. The solutions were coated using a wire wound bar onto the substrate, and heated at 120 C in an oven for 5 min: PVDF coating samples were heated at 200 C for 5 min to provide coatings of 1-2 microns in thickness. The coatings were cured under nitrogen using a Fusion UV system, Inc., Model MC-6RQN, Gaithersburg, Md., equipped with a 500 watt Fusion H-bulb for 3 passes at 10.7 m/min.

The substrate used for coating is 5 mil PET or polyimide film obtained from DuPont, under the trade designations "Melinex 618" or "Kapton" respectively except for the PVDF examples that were coated onto glass.

The cured samples were evaluated according to the test methods previously described. The wt-% of each of the ingredients employed in the compositions and test results are reported in Table 7 as follows. The last three coating compositions in Table 7 were also noted to be clear, repellent to MEK, and repellent to ink ("1" according to the Marker Test).

TABLE 7

(PET Substrate)

| THV-200 | E-15742 | E-18402 | Kynar | PVDF | U6 | HFPO-AEA | TMPTA | Water St CA | Water Rec CA | HD St CA | HD Rec CA |
|---|---|---|---|---|---|---|---|---|---|---|---|
| 100 |  |  |  |  |  |  |  | 97.1 | 84.2 | 50.6 | 36.2 |
| 98 |  |  |  |  | 2 |  |  |  |  | 70.3 | 65.5 |
| 95 |  |  |  |  | 5 |  |  |  |  | 72.0 | 67.1 |
|  | 100 |  |  |  |  |  |  | 94.5 | 74.6 | 53.0 | 35.1 |
|  | 98 |  |  |  | 2 |  |  |  |  | 71.4 | 64.2 |
|  | 95 |  |  |  | 5 |  |  |  |  | 72.7 | 67.4 |
|  |  | 100 |  |  |  |  |  | 95.7 | 74.8 | 54.0 | 36.6 |
|  |  | 98 |  |  | 2 |  |  |  |  | 71.8 | 66.2 |
|  |  | 95 |  |  | 5 |  |  |  |  | 72.2 | 67.2 |
|  |  |  | 100 |  |  |  |  | 85.5 | 76.9 | 34.8 | 20.7 |
|  |  |  | 98 |  | 2 |  |  |  |  | 71.2 | 64.3 |
|  |  |  | 95 |  | 5 |  |  |  |  | 73.0 | 68.5 |
|  |  |  |  | 100 |  |  |  | 80.4 | 71.2 | 27.2 | 15.4 |
|  |  |  |  | 98 | 2 |  |  | 114.3 | 70.3 | 69.1 | 58.8 |
|  |  |  |  | 95 | 5 |  |  |  |  | 71.5 | 64.8 |
| 95 |  |  |  |  |  | 5 |  |  |  | 69.5 | 40.1 |
|  | 95 |  |  |  |  | 5 |  |  |  | 69.2 | 42.4 |
|  |  | 95 |  |  |  | 5 |  |  |  | 69.0 | 42.0 |
| 86.4 |  |  |  |  | 4 |  | 9.6 | 111.0 | 88.9 | 71.2 | 64.1 |
|  |  | 86.4 |  |  | 4 |  | 9.6 | 116.2 | 88.4 | 70.2 | 66.6 |
|  |  |  |  |  | U1 | FC-4 |  |  |  |  |  |
| 96* |  |  |  |  | 2 | 2 |  | 111.3 |  | 75.5 |  |

CA is contact angle in degrees, St is static, Rec is receding, HD is hexadecane.
U1 is HFPO-U-1. U6 is HFPO-U-6.
*Cured using 3 passes at 4.57 m/min Fluoropolymer/TMPTA/HFPO urethane multiacrylate coatings were used as negative photoimaging materials: The imaging areas retain high water and oil contact/receding angles while the coating areas unexposed by UV were completely removed when developed by MEK solvent, those areas showed typical PET and polyimide oil and water contact and receding angles. The water contact angle for polyimide is 73°

The coatings in Table 8 were coated and cured as in the Table above with the following exceptions. 1) A photomask was placed on the dried coatings prior to UV curing, 2) the UV curing used the same equipment and bulb, but was subjected to 10 passes at 10.7 m/second, and 3) After photoimaging, the coatings were developed in a bath of MEK for several minutes to provide the final imaged substrate, in which light exposed areas remained and unexposed materials were washed away.

| Substrate | ratio E18402/TMPTA (90:10) | ratio Kynar/TMPTA (90:10) | ratio THV200/ TMPTA (90:10) | ratio PVDF/ TMPTA (90:10) | Wt % U-6 | MEK Repell. test | Water Static CA (o) | Water Rec CA (o) | Hexadecane Static CA (o) | Hexadecane Rec CA (o) |
|---|---|---|---|---|---|---|---|---|---|---|
| polyimide | 95 | | | | 5 | Repel | 116.6 | 72.2 | 65.5 | 50.1 |
| Polyimide | | 95 | | | 5 | Repel | 118.4. | 73.2 | 68.9 | 50.3 |
| Polyimide | | | 95 | | 5 | Repel | 114.4 | 74.2 | 66.8 | 49.2 |
| Polyimide | | | | 95 | 5 | Repel | 110.0 | 70.4 | 65.2 | 50.3 |
| PET | 95 | | | | 5 | Repel | 122.4 | 74.3 | 70.6 | 52.5 |
| PET | | 95 | | | 5 | Repel | 120.0 | 68.5 | 67.5 | 49.9 |
| PET | | | 95 | | 5 | Repel | 120.3 | 79.3 | 69.3 | 52.4 |
| PET | | | | 95 | 5 | Repel | 112.1 | 85.3 | 72.1 | 60.4 |

What is claimed is:

1. A composition having a refractive index of less than 1.47 comprising
   i) one or more free-radically polymerizable materials, each having a fluorine content of at least about 25 wt-%, and
   ii) at least one free-radically polymerizable fluoropolyether urethane material having a fluorine content ranging from about 10 wt-% to about 30 wt-%; wherein ii) has a fluorine content less than i).

2. A composition suitable for use as a low refractive index coating comprising
   i) greater than 20 wt-% of one or more free-radically polymerizable materials, each having a fluorine content of at least about 25 wt-%, and
   ii) at least one free-radically polymerizable fluoropolyether urethane material having a fluorine content ranging from about 10 wt-% to about 30 wt-%; wherein ii) has a fluorine content less than i).

3. The composition of claim 1 wherein ii) has a fluorine content ranging from about 5 wt-% to about 40 wt-% fluorine.

4. The composition of claim 1 wherein ii) has a fluorine content ranging from about 10 wt-% to about 30 wt-% fluorine.

5. The composition of claim 1 wherein i) is present at a ratio to ii) ranging from about 1:1 to 5:1.

6. The composition of claim 1 wherein the composition comprises about 15 wt-% to about 45 wt-% fluorine.

7. The composition of claim 1 wherein i) is present in the polymerizable composition in an amount ranging from greater than 20 wt-% to 70 wt-% solids of the organic composition.

8. The composition of claim 1 wherein the composition comprises surface modified inorganic nanoparticles.

9. The composition of claim 8 wherein the surface modified inorganic particles comprise silica.

10. The composition of claims 1 wherein the fluoropolyether urethane material comprises a HFPO— moiety.

11. The composition of claim 1 wherein i) comprises at least one free-radically polymerizable monomer, oligomer, polymer and mixtures thereof comprising at least one moiety selected from fluoropolyether, fluoroalkyl, fluoroalkylene, and mixtures thereof.

12. The composition of claim 1 wherein i) is a fluoropolymer.

13. An antireflective film comprising
   a low refractive index layer comprising the reaction product of a composition comprising
      i) at least one free-radically polymerizable fluoropolymer having a fluorine content of at least about 25 wt-%, and
      ii) at least one free-radically polymerizable fluoropolyether urethane material, and ii) has a fluorine content less than i);
   a high refractive index layer coupled to the low refractive index layer.

14. The antireflective film of claim 13 wherein the high refractive index layer is a light transmissible substrate.

15. A coating composition comprising i) a fluoropolymer and ii) at least one free-radically polymerizable multifunctional fluoropolyether urethane material comprising a HFPO-moiety in an organic solvent wherein ii) has a fluorine content less than i) and the cured coating composition is repellant to the organic solvent of the coating composition.

16. The coating composition of claim 15 wherein the organic solvent comprises a ketone, ester, alcohol, ether, or mixture thereof.

17. A method of photolithography comprising
   coating the composition of claim 15 onto a substrate;
   curing a portion of the coating with radiation, and
   removing at least a portion of the uncured coating with organic solvent.

* * * * *

UNITED STATES PATENT AND TRADEMARK OFFICE
CERTIFICATE OF CORRECTION

PATENT NO. : 7,575,847 B2
APPLICATION NO. : 11/427665
DATED : August 18, 2009
INVENTOR(S) : Naiyong Jing It is certified that error appears in the above-identified patent and that said Letters Patent is hereby corrected as shown below:

<u>Column 1</u>
Line 16, Delete "Muskiant" and insert -- Musikant --, therefor.

<u>Column 3</u>
Line 16-17, Delete "compatiblize" and insert -- compatibilize --, therefor.

<u>Column 4</u>
Line 4, Delete "$(R_f\!-\!\![(W)\!-\!\!(R_A)_d]_e$" and insert -- $(R_f)\!-\![(W)\!-\!(R_A)_d]_e$ --, therefor.

<u>Column 6</u>
Line 22, Delete "1970A"" and insert -- 1970A." --, therefor.

<u>Column 7</u>
Line 14, Delete "caloriometry" and insert -- calorimetry --, therefor.

<u>Column 12</u>
Line 31, Delete "$Y((R_{fc1}O)_xC_{d1}F_{2d})_b,$" and insert -- $Y((R_{fc1}O)_xC_{d1}F_{2d1})_b$, --, therefor.

<u>Column 13</u>
Line 17, Delete "$CH\!-\!CH_2$," and insert -- $CH\!=\!CH_2$, --, therefor.
Line 17, Delete "$(H_2C\!-\!CHC$" and insert -- $(H_2C\!=\!CHC$ --, therefor.

<u>Column 16</u>
Line 29, Delete "Collodial" and insert -- Colloidal --, therefor.

<u>Column 27</u>
Line 12, Delete "Steel Wool Durability Test The abrasion" and insert -- Steel Wool Durability Test: The abrasion --, therefor.

<u>Column 29</u>
Line 48, Delete "compatabilizer" and insert -- compatibilizer --, therefor.
Line 52, Delete "compatabilizer" and insert -- compatibilizer --, therefor.
Line 65, Delete "%R avg" and insert -- %$R_{avg}$ --, therefor.

UNITED STATES PATENT AND TRADEMARK OFFICE
CERTIFICATE OF CORRECTION

PATENT NO. : 7,575,847 B2
APPLICATION NO. : 11/427665
DATED : August 18, 2009
INVENTOR(S) : Naiyong Jing It is certified that error appears in the above-identified patent and that said Letters Patent is hereby corrected as shown below:

<u>Column 34</u>
Line 57, Delete "73°'" and insert -- 73°. --, therefor.

<u>Column 35</u>
Line 51, In Claim 10, delete "claims 1" and insert -- claim 1 --, therefor.

Signed and Sealed this

Sixth Day of October, 2009

David J. Kappos
*Director of the United States Patent and Trademark Office*